(12) United States Patent
Yang et al.

(10) Patent No.: US 7,214,326 B1
(45) Date of Patent: *May 8, 2007

(54) INCREASED CAPACITY LEADFRAME AND SEMICONDUCTOR PACKAGE USING THE SAME

(75) Inventors: Sung Jin Yang, Gangnam-gu (KR); Doo Hwan Moon, Gwangjin-gu (KR); Won Dai Shin, Gwanak-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 169 days.

This patent is subject to a terminal disclaimer.

(21) Appl. No.: 11/039,434

(22) Filed: Jan. 19, 2005

Related U.S. Application Data

(63) Continuation-in-part of application No. 10/703,301, filed on Nov. 7, 2003, now Pat. No. 7,144,517.

(51) Int. Cl.
*H01B 13/00* (2006.01)
*C23F 1/00* (2006.01)

(52) U.S. Cl. ............................ 216/13; 216/41; 216/33; 216/36; 438/106

(58) Field of Classification Search .................. 216/13, 216/41, 33, 36; 438/106
See application file for complete search history.

(56) References Cited

U.S. PATENT DOCUMENTS

| 2,596,993 A | 5/1952 | Gookin |
| 3,435,815 A | 4/1969 | Forcier |

(Continued)

FOREIGN PATENT DOCUMENTS

| DE | 19734794 A1 | 8/1997 |
| EP | 0393997 | 10/1990 |

(Continued)

OTHER PUBLICATIONS

National Semiconductor Corporation, "Leadless Leadframe Package," Informational Pamphlet from webpage, 21 pages, Oct. 2002, www.national.com.

(Continued)

*Primary Examiner*—Shamim Ahmed
(74) *Attorney, Agent, or Firm*—Stetina Brunda Garred & Brucker

(57) ABSTRACT

In accordance with the present invention, there is provided a method for manufacturing a semiconductor package. The method comprises the initial step of applying first and second photoresist layers to respective ones of opposed first and second surfaces of a metal plate which includes a die paddle and a plurality of leads extending at least partially about the die paddle in spaced relation thereto. The first and second photoresist layers are then patterned to expose the die paddle and prescribed portions of each of the leads. Thereafter, first and second conductive layers are applied to portions of respective ones of the first and second surfaces which are not covered by the first and second photoresist layers. The first and second photoresist layers are then removed to facilitate the creation of an exposed area in each of leads which is not covered by the first and second conductive layers. Next, a semiconductor die is attached to a portion of the first conductive layer covering the die paddle and electrically connected to portions of the first conductive layer covering the leads. The semiconductor die, the die paddle, the leads and the first and second conductive layers are then encapsulated with a package body such that portions of the second conductive layer covering the die paddle and the leads, and the exposed area of each of the leads are exposed in a common surface of the package body. Finally, the exposed area of each of the leads is etched to facilitate the division of the leads into an inner set extending at least partially about the die paddle and an outer set extending at least partially about the inner set.

20 Claims, 17 Drawing Sheets

U.S. PATENT DOCUMENTS

| | | |
|---|---|---|
| 3,734,660 A | 5/1973 | Davies et al. |
| 3,838,984 A | 10/1974 | Crane et al. |
| 4,054,238 A | 10/1977 | Lloyd et al. |
| 4,189,342 A | 2/1980 | Kock |
| 4,258,381 A | 3/1981 | Inaba |
| 4,289,922 A | 9/1981 | Devlin |
| 4,301,464 A | 11/1981 | Otsuki et al. |
| 4,332,537 A | 6/1982 | Slepcevic |
| 4,417,266 A | 11/1983 | Grabbe |
| 4,451,224 A | 5/1984 | Harding |
| 4,530,152 A | 7/1985 | Roche et al. |
| 4,541,003 A | 9/1985 | Otsuka et al. |
| 4,646,710 A | 3/1987 | Schmid et al. |
| 4,707,724 A | 11/1987 | Suzuki et al. |
| 4,727,633 A | 3/1988 | Herrick |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasarathi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,683,943 A * | 11/1997 | Yamada ..................... 216/14 |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |

| | | | | | | |
|---|---|---|---|---|---|---|
| 5,866,939 | A | 2/1999 | Shin et al. | 6,222,259 B1 | 4/2001 | Park et al. |
| 5,871,782 | A | 2/1999 | Choi | 6,225,146 B1 | 5/2001 | Yamaguchi et al. |
| 5,874,784 | A | 2/1999 | Aoki et al. | 6,229,200 B1 | 5/2001 | Mclellan et al. |
| 5,877,043 | A | 3/1999 | Alcoe et al. | 6,229,205 B1 | 5/2001 | Jeong et al. |
| 5,886,397 | A | 3/1999 | Ewer | 6,239,367 B1 | 5/2001 | Hsuan et al. |
| 5,886,398 | A | 3/1999 | Low et al. | 6,239,384 B1 | 5/2001 | Smith et al. |
| 5,894,108 | A | 4/1999 | Mostafazadeh et al. | 6,242,281 B1 | 6/2001 | Mclellan et al. |
| 5,897,339 | A | 4/1999 | Song et al. | 6,256,200 B1 | 7/2001 | Lam et al. |
| 5,900,676 | A | 5/1999 | Kweon et al. | 6,258,629 B1 | 7/2001 | Niones et al. |
| 5,903,049 | A | 5/1999 | Mori | 6,281,566 B1 | 8/2001 | Magni |
| 5,903,050 | A | 5/1999 | Thurairajaratnam et al. | 6,281,568 B1 | 8/2001 | Glenn et al. |
| 5,909,053 | A | 6/1999 | Fukase et al. | 6,282,095 B1 | 8/2001 | Houghton et al. |
| 5,915,998 | A | 6/1999 | Stidham et al. | 6,285,075 B1 | 9/2001 | Combs et al. |
| 5,917,242 | A | 6/1999 | Ball | 6,291,271 B1 | 9/2001 | Lee et al. |
| 5,939,779 | A | 8/1999 | Kim | 6,291,273 B1 | 9/2001 | Miyaki et al. |
| 5,942,794 | A | 8/1999 | Okumura et al. | 6,294,100 B1 | 9/2001 | Fan et al. |
| 5,951,305 | A | 9/1999 | Haba | 6,294,830 B1 | 9/2001 | Fjelstad |
| 5,959,356 | A | 9/1999 | Oh | 6,295,977 B1 | 10/2001 | Ripper et al. |
| 5,969,426 | A | 10/1999 | Baba et al. | 6,297,548 B1 | 10/2001 | Moden et al. |
| 5,973,388 | A | 10/1999 | Chew et al. | 6,303,984 B1 | 10/2001 | Corisis |
| 5,976,912 | A | 11/1999 | Fukutomi et al. | 6,303,997 B1 | 10/2001 | Lee |
| 5,977,613 | A | 11/1999 | Takata et al. | 6,307,272 B1 | 10/2001 | Takahashi et al. |
| 5,977,615 | A | 11/1999 | Yamaguchi et al. | 6,309,909 B1 | 10/2001 | Ohgiyama |
| 5,977,630 | A | 11/1999 | Woodworth et al. | 6,316,822 B1 | 11/2001 | Venkateshwaran et al. |
| 5,981,314 | A | 11/1999 | Glenn et al. | 6,316,838 B1 | 11/2001 | Ozawa et al. |
| 5,986,333 | A | 11/1999 | Nakamura | 6,323,550 B1 | 11/2001 | Martin et al. |
| 5,986,885 | A | 11/1999 | Wyland | 6,326,243 B1 | 12/2001 | Suzuya et al. |
| 6,001,671 | A | 12/1999 | Fjelstad | 6,326,244 B1 | 12/2001 | Brooks et al. |
| 6,013,947 | A | 1/2000 | Lim | 6,326,678 B1 | 12/2001 | Karmezos et al. |
| 6,018,189 | A | 1/2000 | Mizuno | 6,335,564 B1 | 1/2002 | Pour |
| 6,020,625 | A | 2/2000 | Qin et al. | 6,337,510 B1 | 1/2002 | Chun-Jen et al. |
| 6,025,640 | A | 2/2000 | Yagi et al. | 6,339,255 B1 | 1/2002 | Shin |
| 6,031,279 | A | 2/2000 | Lenz | 6,348,726 B1 | 2/2002 | Bayan et al. |
| RE36,613 | E | 3/2000 | Ball | 6,355,502 B1 | 3/2002 | Kang et al. |
| 6,034,423 | A | 3/2000 | Mostafazadeh et al. | 6,369,447 B2 | 4/2002 | Mori |
| 6,040,626 | A | 3/2000 | Cheah et al. | 6,369,454 B1 | 4/2002 | Chung |
| 6,043,430 | A | 3/2000 | Chun | 6,373,127 B1 | 4/2002 | Baudouin et al. |
| 6,060,768 | A | 5/2000 | Hayashida et al. | 6,380,048 B1 | 4/2002 | Boon et al. |
| 6,060,769 | A | 5/2000 | Wark | 6,384,472 B1 | 5/2002 | Huang |
| 6,072,228 | A | 6/2000 | Hinkle et al. | 6,388,336 B1 | 5/2002 | Venkateshwaran et al. |
| 6,075,284 | A | 6/2000 | Choi et al. | 6,395,578 B1 | 5/2002 | Shin et al. |
| 6,081,029 | A | 6/2000 | Yamaguchi | 6,400,004 B1 | 6/2002 | Fan et al. |
| 6,084,310 | A | 7/2000 | Mizuno et al. | 6,410,979 B2 | 6/2002 | Abe |
| 6,087,715 | A | 7/2000 | Sawada et al. | 6,414,385 B1 | 7/2002 | Huang et al. |
| 6,087,722 | A | 7/2000 | Lee et al. | 6,420,779 B1 | 7/2002 | Sharma et al. |
| 6,100,594 | A | 8/2000 | Fukui et al. | 6,429,508 B1 | 8/2002 | Gang |
| 6,113,473 | A | 9/2000 | Constantini et al. | 6,437,429 B1 | 8/2002 | Su et al. |
| 6,114,752 | A | 9/2000 | Huang et al. | 6,444,499 B1 | 9/2002 | Swiss et al. |
| 6,118,174 | A | 9/2000 | Kim | 6,448,633 B1 | 9/2002 | Yee et al. |
| 6,118,184 | A | 9/2000 | Ishio et al. | 6,452,279 B2 | 9/2002 | Shimoda |
| RE36,907 | E | 10/2000 | Templeton, Jr. et al. | 6,459,148 B1 | 10/2002 | Chun-Jen et al. |
| 6,130,115 | A | 10/2000 | Okumura et al. | 6,464,121 B2 | 10/2002 | Reijnders |
| 6,130,473 | A | 10/2000 | Mostafazadeh et al. | 6,475,646 B2 * | 11/2002 | Park et al. .................. 428/670 |
| 6,133,623 | A | 10/2000 | Otsuki et al. | 6,476,469 B2 | 11/2002 | Huang et al. |
| 6,140,154 | A | 10/2000 | Hinkle et al. | 6,476,474 B1 | 11/2002 | Hung |
| 6,143,981 | A | 11/2000 | Glenn | 6,482,680 B1 | 11/2002 | Khor et al. |
| 6,169,329 | B1 | 1/2001 | Farnworth et al. | 6,498,099 B1 | 12/2002 | McLellan et al. |
| 6,177,718 | B1 | 1/2001 | Kozono | 6,498,392 B2 | 12/2002 | Azuma |
| 6,181,002 | B1 | 1/2001 | Juso et al. | 6,507,096 B2 | 1/2003 | Gang |
| 6,184,465 | B1 | 2/2001 | Corisis | 6,507,120 B2 | 1/2003 | Lo et al. |
| 6,184,573 | B1 | 2/2001 | Pu | 6,534,849 B1 | 3/2003 | Gang |
| 6,194,777 | B1 | 2/2001 | Abbott et al. | 6,545,332 B2 | 4/2003 | Huang |
| 6,197,615 | B1 | 3/2001 | Song et al. | 6,545,345 B1 | 4/2003 | Glenn et al. |
| 6,198,171 | B1 | 3/2001 | Huang et al. | 6,559,525 B2 | 5/2003 | Huang |
| 6,201,186 | B1 | 3/2001 | Daniels et al. | 6,566,168 B2 | 5/2003 | Gang |
| 6,201,292 | B1 | 3/2001 | Yagi et al. | 6,583,503 B2 | 6/2003 | Akram et al. |
| 6,204,554 | B1 | 3/2001 | Ewer et al. | 6,603,196 B2 | 8/2003 | Lee et al. |
| 6,208,020 | B1 | 3/2001 | Minamio et al. | 6,624,005 B1 | 9/2003 | Di Caprio et al. |
| 6,208,021 | B1 | 3/2001 | Ohuchi et al. | 6,667,546 B2 | 12/2003 | Huang et al. |
| 6,208,023 | B1 | 3/2001 | Nakayama et al. | 7,053,469 B2 * | 5/2006 | Koh et al. .................. 257/676 |
| 6,211,462 | B1 | 4/2001 | Carter, Jr. et al. | 2001/0008305 A1 | 7/2001 | McLellan et al. |
| 6,218,731 | B1 | 4/2001 | Huang et al. | 2001/0014538 A1 | 8/2001 | Kwan et al. |
| 6,222,258 | B1 | 4/2001 | Asano et al. | 2002/0011654 A1 | 1/2002 | Kimura |

| | | | | | | |
|---|---|---|---|---|---|---|
| 2002/0024122 | A1 | 2/2002 | Jung et al. | JP | 1251747 | 10/1989 |
| 2002/0027297 | A1 | 3/2002 | Ikenaga et al. | JP | 2129948 | 5/1990 |
| 2002/0140061 | A1 | 10/2002 | Lee | JP | 369248 | 7/1991 |
| 2002/0140068 | A1 | 10/2002 | Lee et al. | JP | 3177060 | 8/1991 |
| 2002/0163015 | A1 | 11/2002 | Lee et al. | JP | 4098864 | 9/1992 |
| 2003/0030131 | A1 | 2/2003 | Lee et al. | JP | 5129473 | 5/1993 |
| 2003/0073265 | A1 | 4/2003 | Hu et al. | JP | 5166992 | 7/1993 |
| 2003/0164554 | A1* | 9/2003 | Fee et al. .................... 257/787 | JP | 5283460 | 10/1993 |
| 2004/0056277 | A1 | 3/2004 | Karnezos | JP | 692076 | 4/1994 |
| 2004/0061212 | A1 | 4/2004 | Karnezos | JP | 6140563 | 5/1994 |
| 2004/0061213 | A1 | 4/2004 | Karnezos | JP | 6260532 | 9/1994 |
| 2004/0063242 | A1 | 4/2004 | Karnezos | JP | 7297344 | 11/1995 |
| 2004/0063246 | A1 | 4/2004 | Karnezos | JP | 7312405 | 11/1995 |
| 2004/0065963 | A1 | 4/2004 | Karnezos | JP | 864634 | 3/1996 |
| 2004/0080025 | A1* | 4/2004 | Kasahara et al. ........... 257/666 | JP | 8083877 | 3/1996 |
| | | | | JP | 8125066 | 5/1996 |
| | | FOREIGN PATENT DOCUMENTS | | JP | 96-4284 | 6/1996 |
| | | | | JP | 8222682 | 8/1996 |
| EP | | 0459493 | 12/1991 | JP | 8306853 | 11/1996 |
| EP | | 0720225 | 3/1996 | JP | 98205 | 1/1997 |
| EP | | 0720234 | 3/1996 | JP | 98206 | 1/1997 |
| EP | | 0794572 A2 | 10/1997 | JP | 98207 | 1/1997 |
| EP | | 0844665 | 5/1998 | JP | 992775 | 4/1997 |
| EP | | 0936671 | 8/1999 | JP | 9293822 | 11/1997 |
| EP | | 0989608 | 3/2000 | JP | 10022447 | 1/1998 |
| EP | | 1032037 | 8/2000 | JP | 10163401 | 6/1998 |
| JP | | 55163868 | 12/1980 | JP | 10199934 | 7/1998 |
| JP | | 5745959 | 3/1982 | JP | 10256240 | 9/1998 |
| JP | | 58160096 | 8/1983 | JP | 00150765 | 5/2000 |
| JP | | 59208756 | 11/1984 | JP | 556398 | 10/2000 |
| JP | | 59227143 | 12/1984 | JP | 2001060648 | 3/2001 |
| JP | | 60010756 | 1/1985 | JP | 200204397 | 8/2002 |
| JP | | 60116239 | 8/1985 | KR | 941979 | 1/1994 |
| JP | | 60195957 | 10/1985 | KR | 9772358 | 11/1997 |
| JP | | 60231349 | 11/1985 | KR | 100220154 | 6/1999 |
| JP | | 6139555 | 2/1986 | KR | 0049944 | 6/2002 |
| JP | | 629639 | 1/1987 | WO | 9956316 | 11/1999 |
| JP | | 6333854 | 2/1988 | WO | 9967821 | 12/1999 |
| JP | | 63067762 | 3/1988 | | | |
| JP | | 63188964 | 8/1988 | | | |
| JP | | 63205935 | 8/1988 | | | |
| JP | | 63233555 | 9/1988 | | | |
| JP | | 63249345 | 10/1988 | | | |
| JP | | 63289951 | 11/1988 | | | |
| JP | | 63316470 | 12/1988 | | | |
| JP | | 64054749 | 3/1989 | | | |
| JP | | 1106456 | 4/1989 | | | |
| JP | | 1175250 | 7/1989 | | | |
| JP | | 1205544 | 8/1989 | | | |

OTHER PUBLICATIONS

Vishay, "4 Milliohms in the So-8: Vishay Siliconix Sets New Record for Power MOSFET On-Resistance," Press Release from webpage, 3 pages, www.vishay.com/news/releases, Nov. 7, 2002.
Patrick Mannion, "MOSFETs Break out of the Shackles of Wire Bonding," Informational Packet, 5 pages, Electronic Design, Mar. 22, 1999 vol. 47, No. 6, www.elecdesign.com/1999/mar2299/ti/0322ti1.shtml.

* cited by examiner

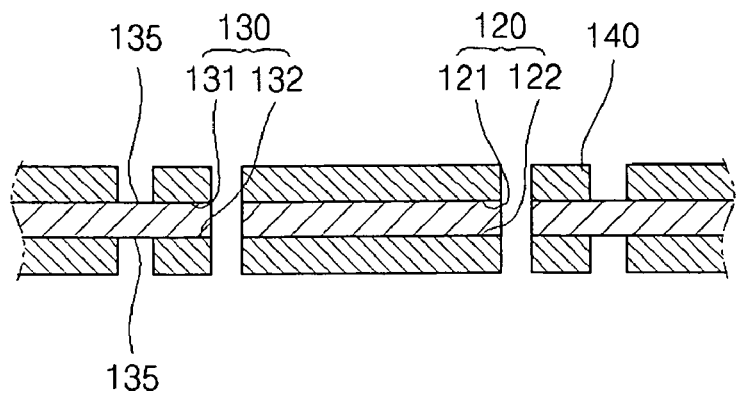
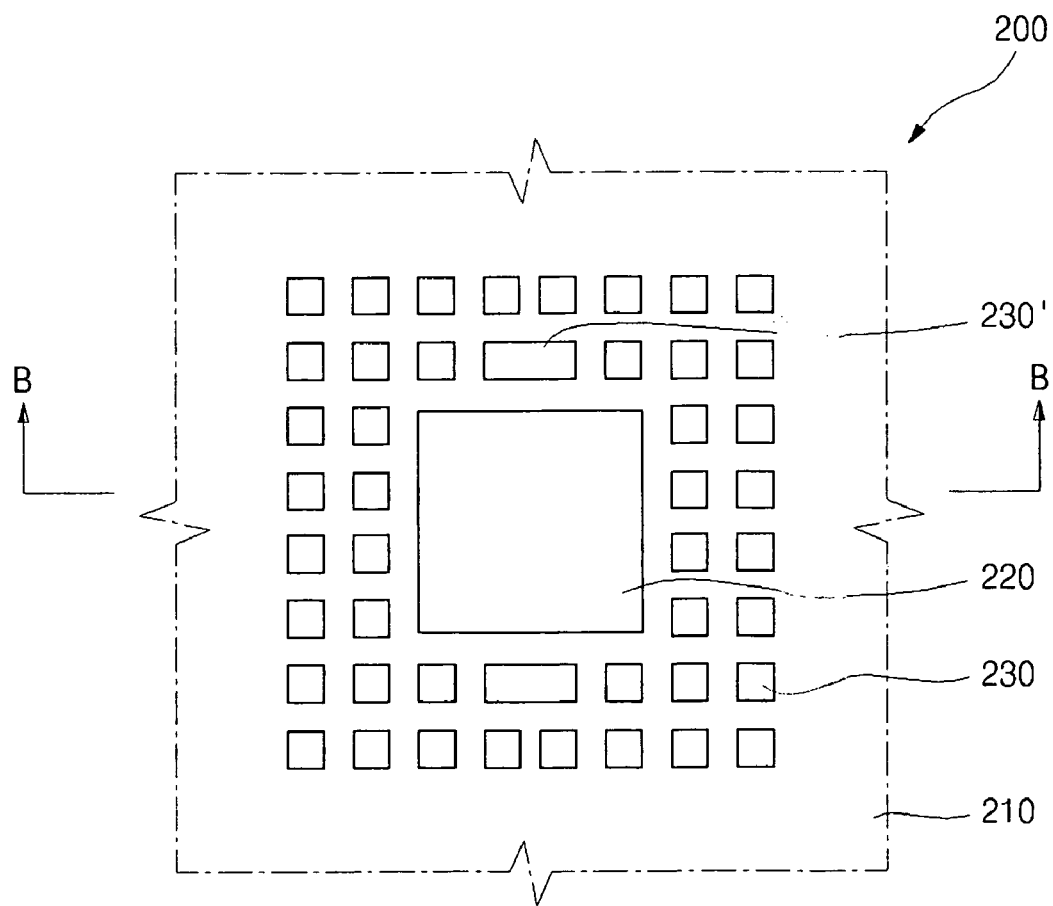

INCREASED CAPACITY LEADFRAME AND SEMICONDUCTOR PACKAGE USING THE SAME

CROSS-REFERENCE TO RELATED APPLICATIONS

The present application is a continuation-in-part of U.S. application Ser. No. 10/703,301 entitled MANUFACTURING METHOD FOR LEADFRAME AND FOR SEMICONDUCTOR PACKAGE USING THE LEADFRAME filed Nov. 7, 2003 now U.S. Pat. No. 7,144,517, the disclosure of which is incorporated herein by reference.

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a method of manufacturing a semiconductor package which includes a plurality of leads arranged in multiple columns and rows.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component.

In the electronics industry, hand held portable applications such as cell phones, PDA's (Personal Digital Assistants), Bluetooth, and IMT2000 require semiconductor packages which are progressively smaller and lighter, yet of increasing performance. In many of the above-described conventional semiconductor packages wherein portions of the leads are partially exposed within the package body, such leads are typically included along only the peripheral edge of the package body. To meet the requirements of current hand held portable applications, the semiconductor packages used therein must have higher electrical performance and functionality, and thus increased numbers of leads which are electrically connectable to an external device. Although it has been suggested in the prior art to narrow the pitch of the leads formed at the periphery of the bottom surface of the package body to increase the number of leads, there are physical limitations in narrowing the lead pitch during the manufacture of the leadframe. Also, excessive narrowing in the lead pitch gives rise to a susceptibility of solder shorting between the leads when the semiconductor package is connected to an external device through the use of solder.

Other currently known semiconductor package designs provide increased numbers of leads by arranging the leads on a common surface of the package body in multiple rows and columns. However, the manufacturing methodology associated with such semiconductor package designs typically involves the completion of a sawing process wherein a saw blade is advanced completely through portions of the leadframe and partially into portions of the package body of the semiconductor package. More particularly, the advancement of the saw blade through portions of the leadframe effectively electrically isolates such portions from each other in a manner facilitating the formation of the multiple columns and rows of leads. However, as a result of the sawing or singulation of the leadframe to facilitate the formation of the leads, the saw blade must necessarily cut into the surface of the package body in which the surfaces of the leads connectable to an underlying substrate are exposed. In these semiconductor packages, the sawing process gives rise to frequent occurrences of chip-out in the package body, as well as the formation of minute cracks in the leads. As a result, the completed semiconductor package may have a weakened mechanical structure. Moreover, the partial cutting of the package body as occurs during the sawing of the leadframe to facilitate the formation of the leads is somewhat unsightly due to the resultant grooves or scratches formed in the corresponding surface of the package body. Further difficulties arise as a result of the mechanical stresses applied to the package body during the sawing process. These and other difficulties are addressed by the semiconductor package manufacturing methodology of the present invention, as will be described in more detail below.

BRIEF SUMMARY OF THE INVENTION

In accordance with the present invention, there is provided a method for fabricating a leadframe having a die paddle and two or more sets of leads which extend at least partially about the die paddle in spaced relation thereto and to each other. In one embodiment of the present invention, the formation of the leads of the leadframe is facilitated by the completion of a chemical etching process to a copper plate of the leadframe subsequent to the application of patterned conductive layers to each of the opposed sides of the copper plate and the partial encapsulation of the leadframe with a package body. In another embodiment of the present invention, the formation of both the leads and the die paddle of the leadframe is facilitated through the removal of a copper plate of the leadframe subsequent to the completion of a chemical etching process to a conductive layer applied to one side of the copper plate and the partial encapsulation of the leadframe with a package body. In yet another embodiment of the present invention, the formation of the leads and the die paddle of the leadframe is facilitated through the removal of a copper plate of the leadframe subsequent the application of a patterned conductive layer to one side of the copper plate and the partial encapsulation of the leadframe with a package body. The electrical isolation of the leads of the leadframe from each other and from the die paddle through the patterning and etching steps of the present invention eliminates the need for the completion of a sawing process as is often used in the fabrication of prior art semiconductor packages including leads arranged in multiple rows and columns.

Further in accordance with the present invention, there is provided a manufacturing method for a semiconductor package including a leadframe wherein the leads alone or in combination with the die paddle are formed through the completion of prescribed patterning and etching steps.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1C is a cross-sectional view of the leadframe of the first embodiment taken along line A—A of FIG. 1B;

FIG. 2A is a top plan view of a leadframe formed in accordance with a second embodiment of the present invention;

Common reference numerals are used throughout the drawings and detailed description to indicate like elements.

DETAILED DESCRIPTION OF THE INVENTION

Figure 1A:
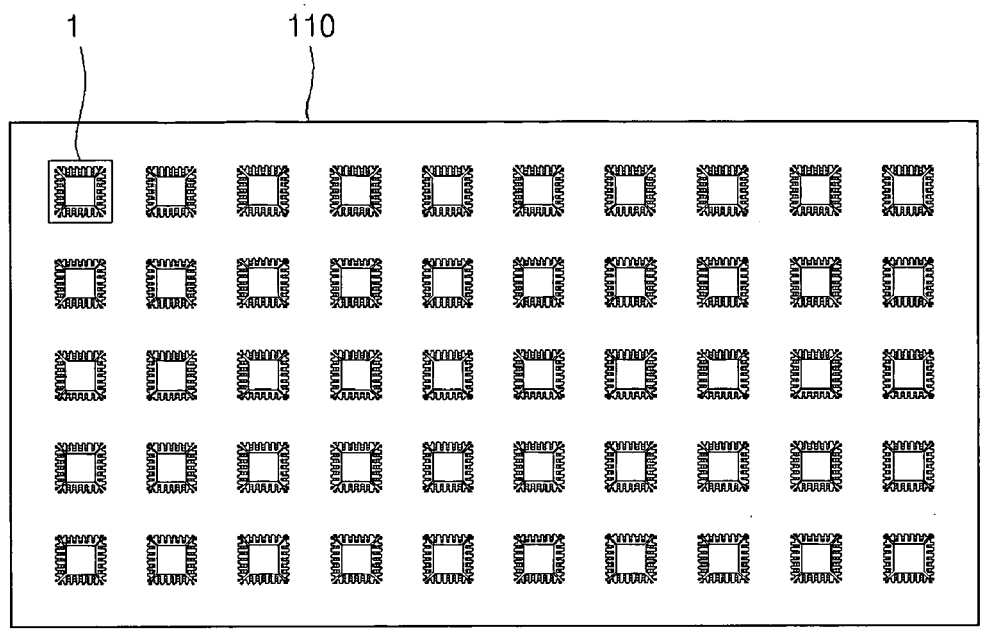
FIG. 1A is a top plan view of a strip having multiple leadframes each formed in accordance with a first embodiment of the present invention disposed thereon.

Referring now to the drawings wherein the showings are for purposes of illustrating preferred embodiments of the present invention only, and not for purposes of limiting the same, FIG. 1A is a top plan view of a leadframe strip having multiple leadframes 100 thereon which are each formed in accordance with a first embodiment of the present invention. The leadframe strip comprises a plate 110 which is preferably fabricated from copper, copper alloy, or an equivalent thereof, though the present invention is not intended to be limited to any particular material for the plate 110. The copper plate 110 is subjected to a chemical etching or mechanical stamping process as facilitates the formation of the individual leadframes 100 thereon. As seen in FIG. 1A, the leadframes 100 are arranged in a matrix-like pattern defining multiple vertical columns and horizontal rows. Those of ordinary skill in the art will recognize that the 5×10 matrix including a total of 50 leadframes 100 formed in the copper plate 110 as shown in FIG. 1A is exemplary only, in that any number of leadframes 100 may be formed in the copper plate 110 in any pattern.

Figure 1B:
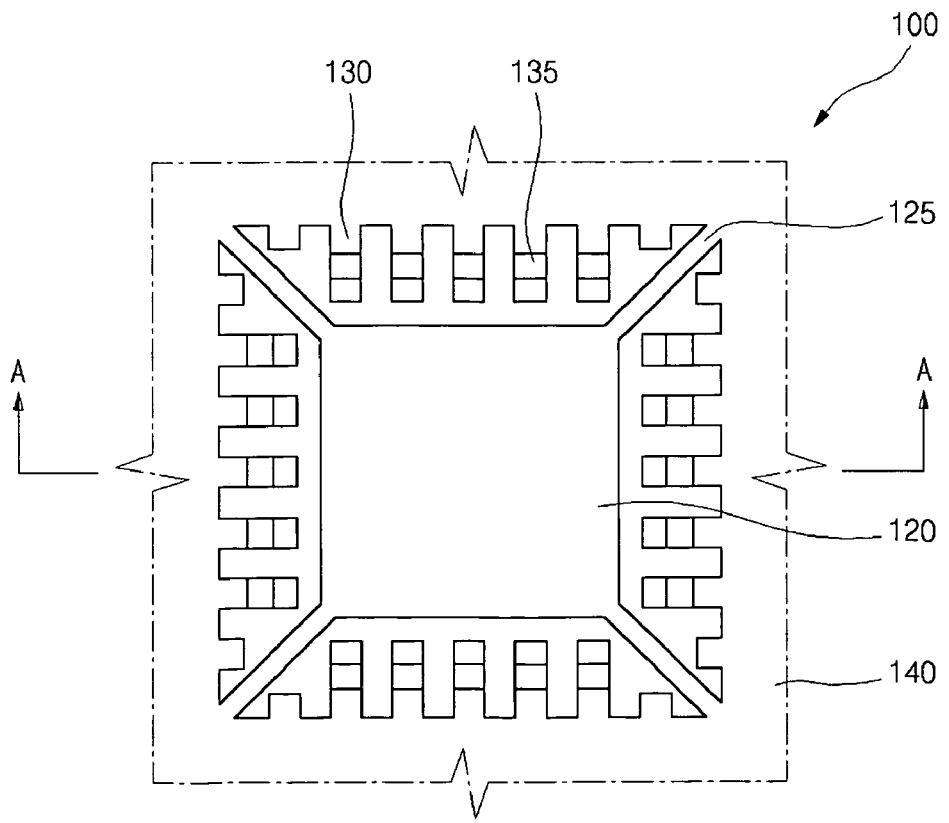
FIG. 1B is a enlargement of the region 1 shown in FIG. 1A, illustrating a leadframe formed in accordance with the first embodiment of the present invention.

Each leadframe 100 comprises a die paddle 120 having a generally planar first (top) surface 121 and an opposed, generally planar second (bottom) surface 122. The die paddle resides within an opening defined by an outer frame of the leadframe 100. As will be recognized, within the leadframe strip shown in FIG. 1A, the outer frames of the leadframes 100 are integrally connected to each other. The die paddle 120 has a generally quadrangular shape defining four sides or peripheral edge segments. Although the die paddle 120 is shown in FIGS. 1A and 1B as having a generally square configuration, those of ordinary skill in the art will recognize that the die paddle 120 may alternatively have any rectangular, octagonal or circular shape, the present invention not being limited to any particular shape for the die paddle 120. Extending diagonally from each of the four corners defined by the die paddle 120 is an elongate tie bar 125 of predetermined length. Though FIGS. 1A and 1B illustrate the tie bars 125 of the leadframe 100 as extending from each of the four corners of the die paddle 120, those of ordinary skill in the art will recognize that less than four tie bars 125 may be included in the leadframe 100, and that the tie bar(s) 125 may extend from any portion of the peripheral edge segment(s) of the die paddle 120.

In addition to the die paddle 120 and tie bars 125, each leadframe 100 comprises a plurality of leads 130 which are attached to the outer frame and extend inwardly therefrom toward the die paddle 120. As best seen in FIGS. 1B and 1C, the leads 130 are arranged to circumvent the die paddle 120, and are segregated into four sets. Each set of the leads 130 extends along and in spaced relation to a respective one of the peripheral edge segments of the die paddle 120. Additionally, each adjacent set of the leads 130 is separated from each other by one of the tie bars 125. Those of ordinary skill in the art will recognize that the leads 130 may have shapes differing from those depicted, and may be provided in numbers fewer or greater than depicted.

In the leadframe 100, each of the leads 130 defines a generally planar first (top) surface 131, and an opposed, generally planar second (bottom) surface 132. As best seen in FIGS. 1B and 1C, plated onto the first surface 121 of the die paddle 120 and the first surfaces 131 of the leads 130 is a first conductive layer 140. As seen in FIG. 1C, the first conductive layer 140 covers the entirety of the first surface 121 of the die paddle 120, and substantial portions of the first surfaces 131 of the leads 130, except for an exposed lead area 135 of each lead 130. The first conductive layer 140 is preferably formed from Ni, Ni/Pd alloy, Ni/Pd/Au alloy or an equivalent thereof, but is not intended to be limited to any specific material. In this regard, the first conductive layer 140 may be formed from any suitable conductive material which is not removed by ammonia or another agent capable of selectively etching and removing metallic copper. The first conductive layer 140 is also formed to be of a predetermined thickness.

As is further seen in FIG. 1C, a second conductive layer 140 is also formed or plated onto the second surface 122 of the die paddle 120, and portions of the second surfaces 132 of the leads 130 other than for exposed lead areas 135. Thus, the first and second conductive layers 140 cover the entirety of the first surfaces 121, 131 and second surfaces 122, 132 of the die paddle 120 and the leads 130 except for the exposed lead areas 135 shown in FIG. 1C. As will be discussed in more detail below, the exposed lead areas 135 are formed/positioned so that each lead 130 can be effectively divided into two leads in a manner which will be described in more detail below.

Figure 4A:
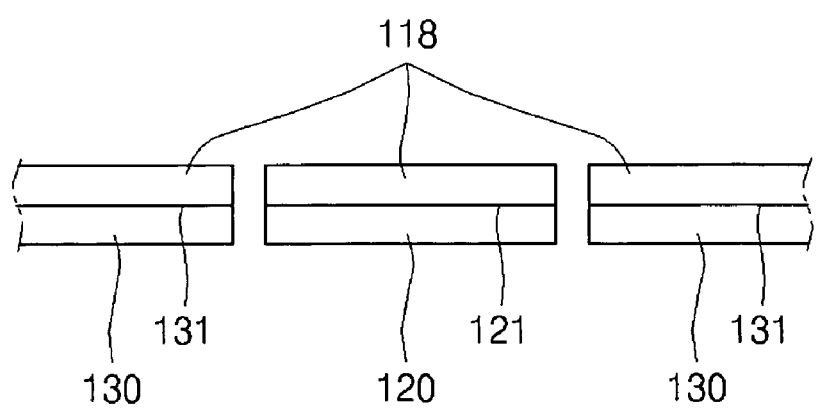
FIGS. 4A–4E illustrate an exemplary sequence of steps which may use to facilitate the fabrication of the leadframe of the first embodiment shown in FIGS. 1A–1C.
Figure 4B:
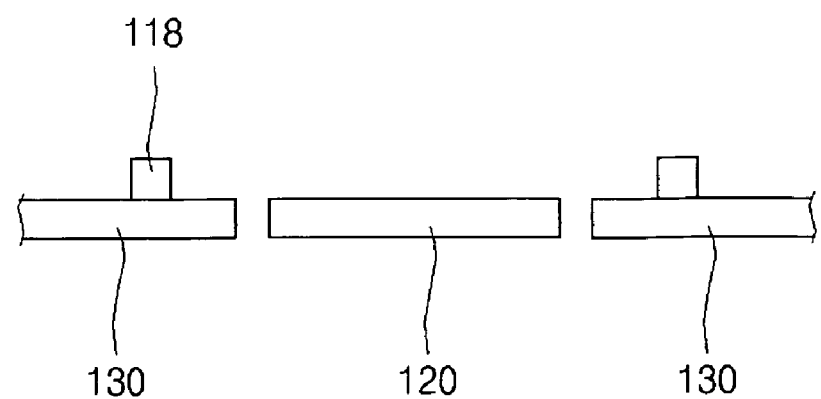

Referring now to FIGS. 4A–4E, there is shown an exemplary sequence of steps which may be used to facilitate the fabrication of the leadframe 100 of the first embodiment of the present invention. After the copper plate 110 has been punched or etched to facilitate the formation of the leadframe 100 having the above-described structural attributes, a photoresist layer 118 of predetermined thickness is applied to the first surfaces 121, 131 of the die paddle 120 and leads 130 of the leadframe 100 (FIG. 4A). Subsequent to the application of the photoresist layer 118 to the first surfaces 121, 131, the photoresist layer 118 is patterned such that the first surfaces 121, 131 of the die paddle 120 and the leads 130 are exposed, except for predetermined areas of the first surfaces 131 of the leads 130 (FIG. 4B). As will be recognized, such predetermined areas of the first surfaces 131 of the leads 130 upon which the photoresist layer 118 remains corresponds to the above-described exposed lead areas 135.

Figure 4C:
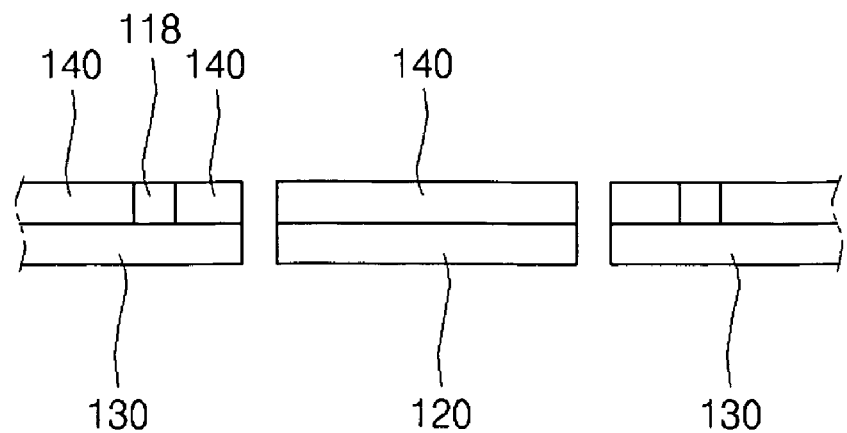
Figure 4D:
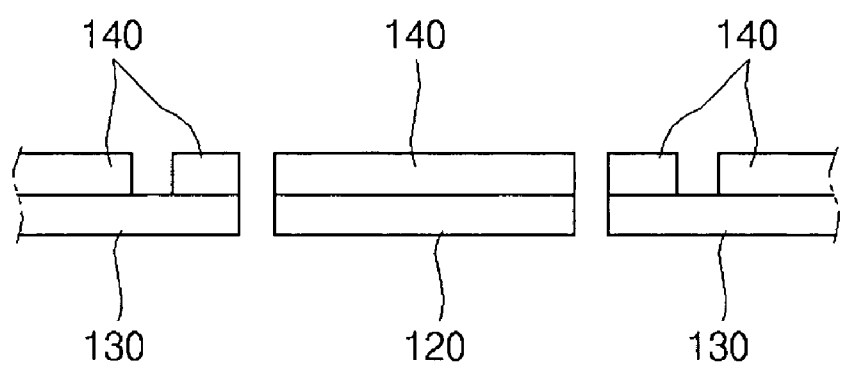
Figure 4E:
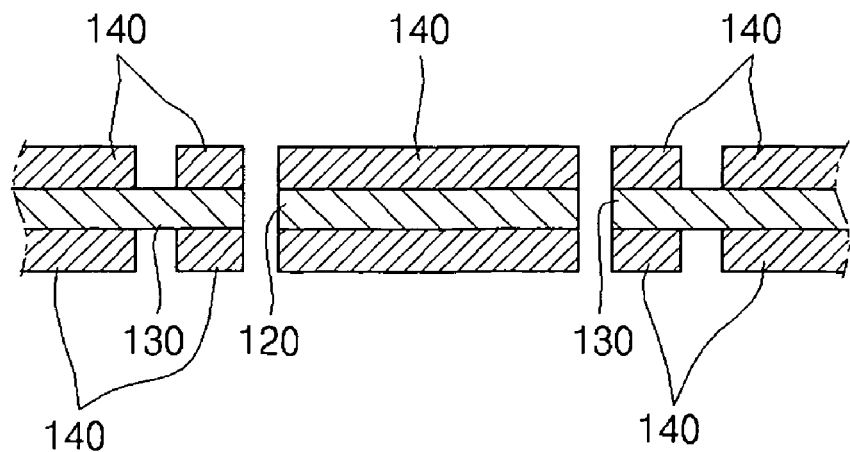

Subsequent to the patterning of the photoresist layer 118, the first conductive layer 140 is plated onto those areas of the first surfaces 121, 131 of the die paddle 120 and the leads 130 except for those areas of the leads 130 where the photoresist layer 118 remains (FIG. 4C). Thereafter, the photoresist layer 118 remaining on the first surfaces 131 of the leads 130 is removed, thus facilitating the formation of the exposed lead areas 135 shown in FIGS. 1B and 1C. Subsequent to the completion of the formation of the first conductive layer 140, the steps described above in relation to FIGS. 4A–4D are repeated on the second surfaces 122, 132 of the die paddle 120 and the leads 130 to facilitate the formation of the second conductive layer 140 (FIG. 4E). The formation of the second conductive layer 140 completes the fabrication of the leadframe 100 shown in FIGS. 1B and 1C. Due to the manner in which the leadframe 100 is formed, the portion of the first conductive layer 140 remaining on the first surface 131 of each lead 130 is effectively divided into an inner section disposed closest to the die paddle 120 and an outer section disposed outward of the inner section, i.e., the inner section is positioned between the die paddle 120 and the outer section. The same holds true for the portion of the second conductive layer 140 remaining on the second surface 132 of each lead 130.

Figure 7A:
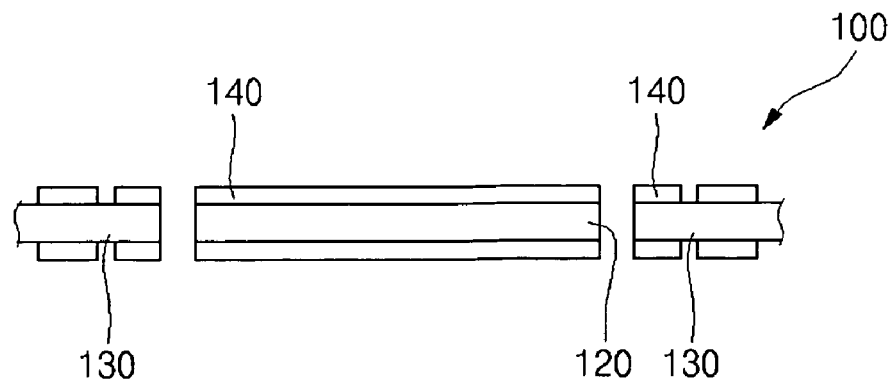
FIGS. 7A–7F illustrate an exemplary sequence of steps which may be used to facilitate the fabrication of a semiconductor package including the leadframe of the first embodiment shown in FIGS. 1A–1C.
Figure 7B:
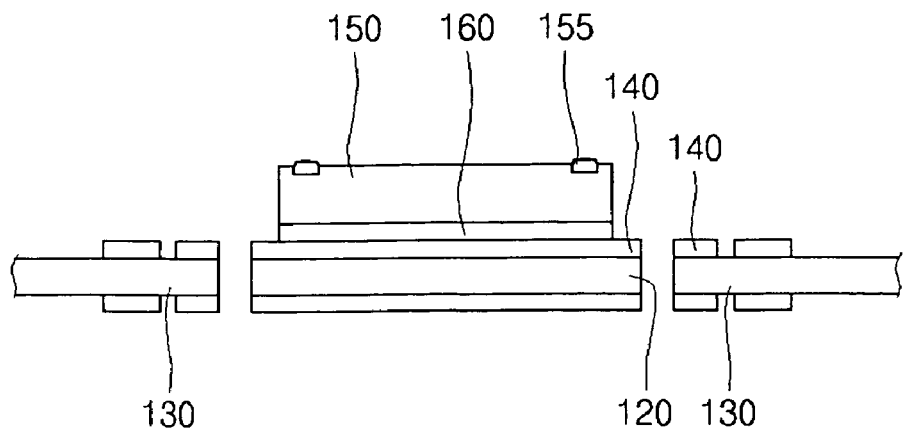

Referring now to FIGS. 7A–7F, there is shown an exemplary sequence of steps which may be used to facilitate the fabrication of a semiconductor package 105 which includes the above-described leadframe 100 constructed in accordance with the first embodiment of the present invention. The initial step of the semiconductor package manufacturing method comprises the fabrication of the leadframe 100 (FIG. 7A). The leadframe 100 is formed through the implementation of the steps described above in relation to FIGS. 4A–4E. Subsequent to the formation of the leadframe 100, a semiconductor die 150 is attached to that portion of the first conductive layer 140 covering the top surface 121 of the die paddle 120, such attachment preferably being facilitated through the use of an adhesive layer 160 (FIG. 7B). The semiconductor die 150 includes a plurality of terminals or bond pads 155 which are disposed on the top surface thereof.

Figure 7C:
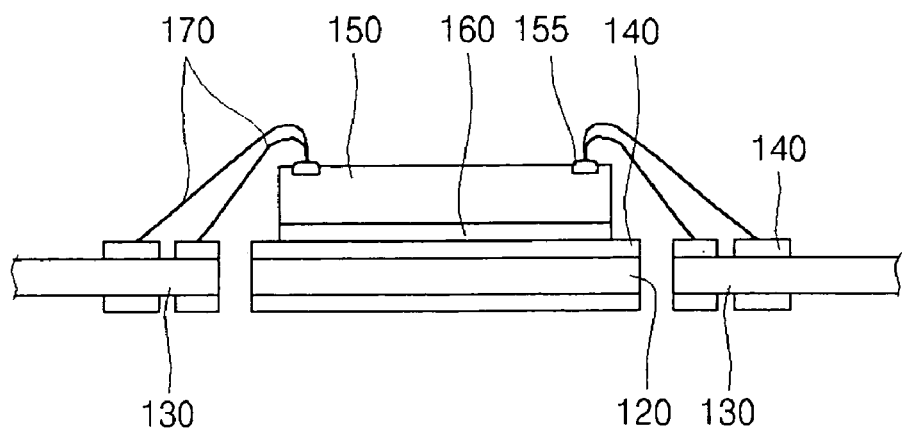

Subsequent to the attachment of the semiconductor die 150 to that portion of the first conductive layer 140 covering the first surface 121 of the die paddle 120, the bond pads 155 of the semiconductor die 150 are electrically connected to at least some of the inner and outer sections of the first conductive layer 140 remaining on the first surfaces 131 of the leads 130 through the use of conductive wires 170 (FIG. 7C). The conductive wires 170 may each comprise an aluminum wire, a gold wire, a copper wire or an equivalent thereof, the present invention not being limited to any specific material for the conductive wires 170.

Figure 7D:
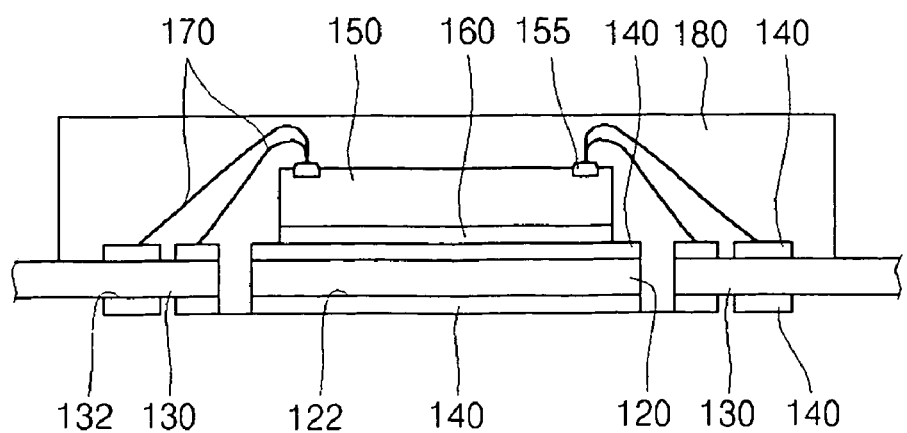

Subsequent to the electrical connection of the semiconductor die 150 to the inner and outer sections of the first conductive layer 140 through the use of the conductive wires 170, portions of the die paddle 120, leads 130, first and second conductive layers 140, semiconductor die 150, and conductive wires 170 are encapsulated with an encapsulant which, upon hardening, forms a package body 180 of the semiconductor package 105 (FIG. 7D). The package body 180, and in particular the encapsulant used to fabricate the same, may be made of an epoxy molding compound, glop top material, or an equivalent thereof, though the present invention is not limited to any particular material for the package body 180. As is seen in FIG. 7D, that portion of the second conductive layer 140 covering the second surface 122 of the die paddle 120 is exposed in and substantially flush with the bottom surface of the package body 180, as are the inner and outer sections of the second conductive layer 140 remaining on the second surface 132 of each lead 130. Thus, also exposed in the bottom surface of the package body is the exposed lead area 135 of the second surface 132 of each lead 130.

Figure 7E:
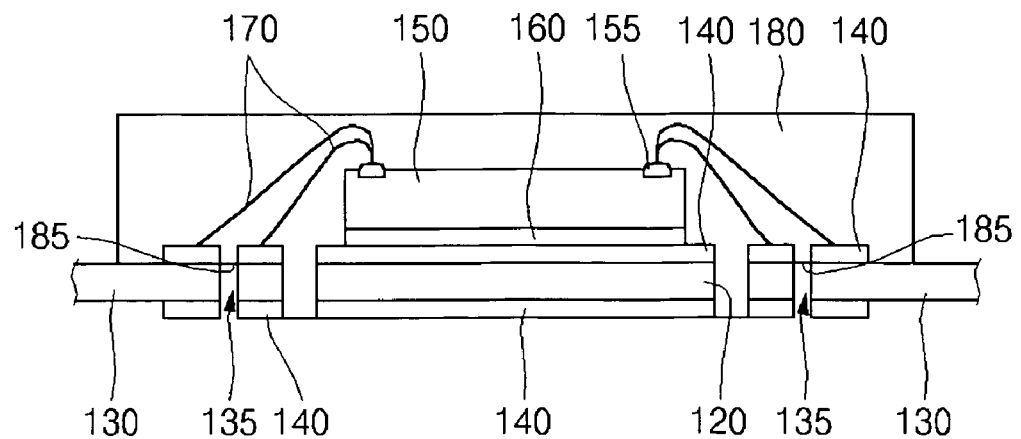

Subsequent to the formation of the package body 180, each of the leads 130 is subjected to an etching process (FIG. 7E). More particularly, an etching agent, such as ammonia, is applied to the exposed lead areas 135 of the second surfaces 132 of the leads 130, thereby selectively removing copper from each of the leads 130. In this regard, the copper of each lead 130 is removed in generally a column which extends from the exposed lead area 135 at the second surface 132 to the exposed lead area 135 at the first surface 131, as is shown in FIG. 7E. As a result, the completion of the copper removal process divides the leads 130 into two separate sets, i.e., an inner set which circumvents the die paddle 120, and an outer set which circumvents the inner set. As a result of the copper removal facilitated by the completion of the etching process, the package body 180 defines recessed surfaces 185 which are perpendicularly recessed or offset from the bottom surface thereof in which the remaining portions of the second conductive layer 140 are exposed.

Figure 7F:
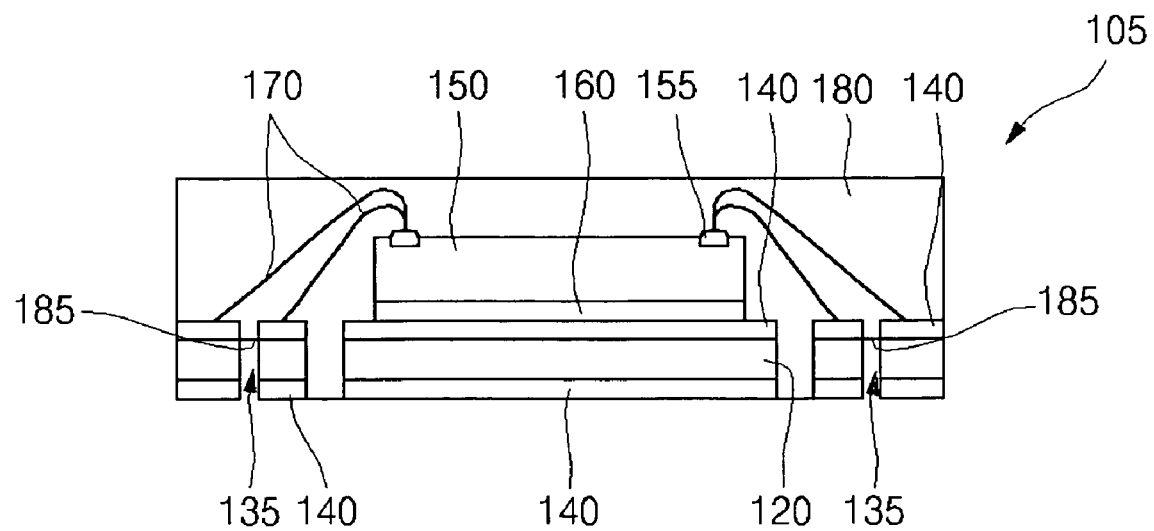

Upon the completion of the etching process, a singulation step is completed wherein that portion of the package body 180 extending outwardly beyond the leads of the outer set is removed, as are those portions of the leads 130 which are not covered by a portion of the first and second conductive layers 140, and thus do not form part of the leads of the inner and outer sets (FIG. 7F). The singulation step may be completed through the implementation of either a punching process or a sawing process using a diamond saw. As a result of the completion of the singulation process, the outer ends of the leads of the outer set are exposed in and substantially flush with respective side surfaces of the package body 180. As will be recognized, each of the leads of the outer set formed as a result of the etching process comprises a segment of one of the originally formed leads 130, along with a corresponding pair of the outer sections of the first and second conductive layers 140. Similarly, each of the leads of the inner set comprises a segment of one of the originally formed leads 130 along with a corresponding pair of the inner sections of the first and second conductive layers 140.

Figure 8:
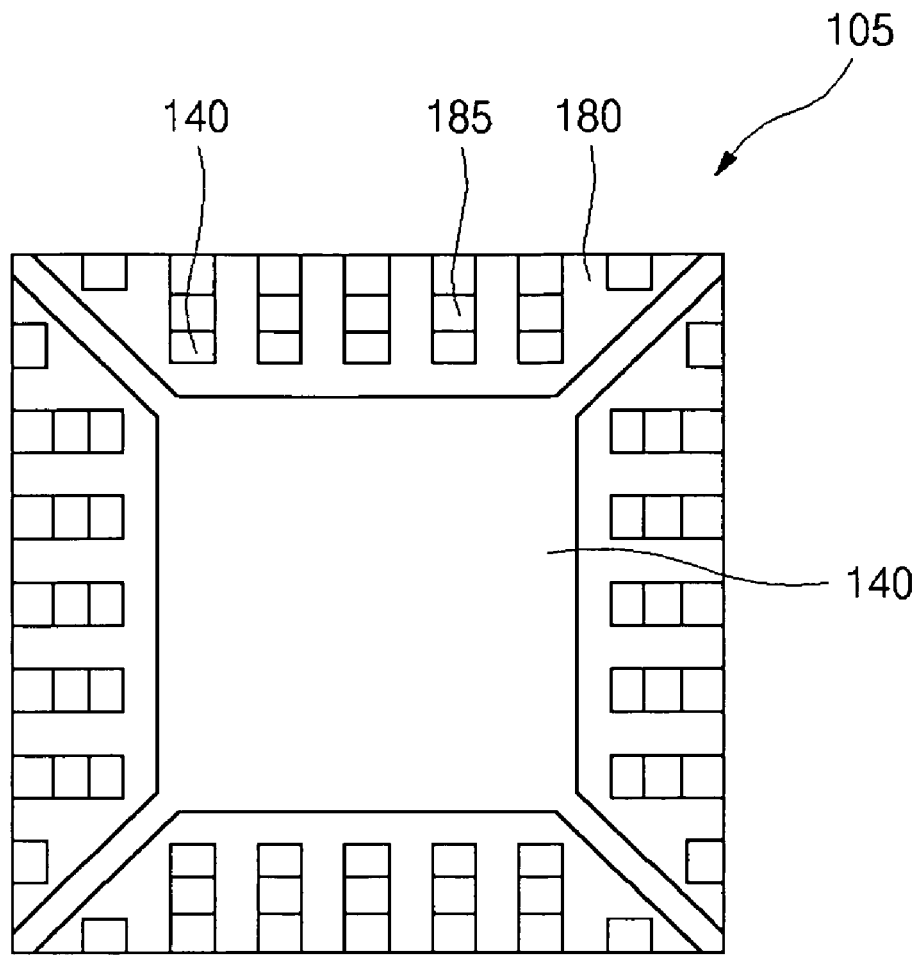
FIG. 8 is a bottom plan view of a semiconductor package including the leadframe of the first embodiment shown in FIGS. 1A–1C.

A bottom plan view of the completed semiconductor package 105 fabricated to include the leadframe 100 as subjected to the above-described etching process is shown in FIG. 8. In the complete semiconductor package 105, the portion of the second conductive layer 140 covering the second surface 122 of the die paddle 120 is exposed in and substantially flush with the bottom surface of the package body 180. Also exposed in and substantially flush with the bottom surface of the package body 180 are the inner and outer sections of the second conductive layer 140 which remain on the leads of the inner and outer sets. As explained above, visually apparent from the bottom plan view of the semiconductor package 105 are the recessed surfaces 185 of the package body 180 which are exposed as a result of the etching process. Further exposed in the bottom surface of the package body 180 are portions of the second conductive layer 140 which are applied to and thus cover the second or bottom surfaces of the tie bars 125. The semiconductor package 105 fabricated to include the leadframe 100 has an increased number of leads (i.e., both the inner and outer sets), and hence available input and output terminals. In addition, there is no requirement to saw the leads 130 of the leadframe 100 or the package body 180 to facilitate the electrical isolation of the inner and outer sets of leads during the manufacture of the semiconductor package 105. Thus, the semiconductor package 105 is not physically impacted by a sawing process, and thus does not suffer the above-described deficiencies attendant to the lead sawing process.

As indicated above, the semiconductor package 105 shown in FIG. 8 includes an inner set of leads and an outer set of leads effectively formed by the division of the leads 130 of the leadframe 100 in the above-described manner. Those of ordinary skill in the art will recognize that the above-described methodology employed to facilitate the fabrication of the leadframe 100 and thereafter the complete semiconductor package 105 may also be used to facilitate the formation of a semiconductor package including more than two sets of leads, e.g., an inner set of leads, a middle set of leads, and an outer set of leads. In such modified process, the photoresist layers 118 discussed above may be patterned such that upon the formation of the first and second conductive layers 140, each lead 130 includes two or more exposed lead areas 135 on each of the first and second surfaces 131, 132 thereof. Thus, as a result of the etching of the leads 130, each such lead 130 may be effectively divided into three or more separate leads and hence more than two sets thereof, each of the resultant leads being electrically insulated from each other in the same manner the inner and outer sets of the leads of the semiconductor package 105 are electrically insulated from each other.

Figure 2B:
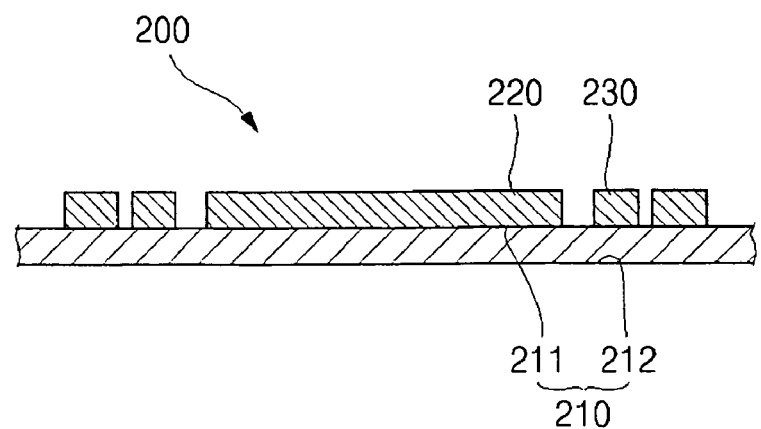
FIG. 2B is a cross-sectional view of the leadframe of the second embodiment taken along line B—B of FIG. 2A.

Referring now to FIGS. 2A and 2B, there is shown a leadframe 200 which is formed in accordance with a second embodiment of the present invention. The leadframe 200 comprises a copper plate 210 which has a generally planar first (top) surface 211 and an opposed, generally second (bottom) surface 212. In addition to the copper plate 210, the leadframe 200 comprises a die paddle 220 which preferably has a generally quadrangular shape defining four sides or peripheral edge segments. Though the die paddle 220 is shown in FIG. 2A as having a generally square configuration, those of ordinary skill in the art will recognize that the die paddle 220 may alternatively have any rectangular, octagonal, or circular shape, the present invention not being limited to any particular shape for the die paddle 220.

The leadframe 200 further comprises a plurality of leads 230. As seen in FIGS. 2A and 2B, the leads 230 are arranged in an inner set which circumvents the die paddle 220, and an outer set which circumvents the inner set. The leads 230 of the inner and outer sets each have a quadrangular configuration, though those of ordinary skill in the art will recognize that the leads 230 of the inner and outer sets may have differing shapes. Included with the leads 230 of the inner set are two generally rectangular leads 230' which differ from the remaining leads 230 of the first set which are each generally square. The leads 230' of the inner set may be used for intermediating signals between a semiconductor die and other leads 230 as will be discussed in more detail below.

In the leadframe 200, both the die paddle 220 and the leads 230 of the inner and outer sets are formed from a conductive layer which is applied to the first surface 211 of the copper plate 210 and patterned in a manner which will be described in more detail below. As with the first and second conductive layers 140 described above in relation to the leadframe 100, the conductive layer of the leadframe 200 is formed from a suitable conductive material which is not removed by ammonia or another agent capable of selectively etching and removing copper, exemplary materials for the conductive layer being the same as described above in relation to the first and second conductive layers 140. The conductive layer of the leadframe 200 is also formed to be of predetermined thickness.

Figure 5A:
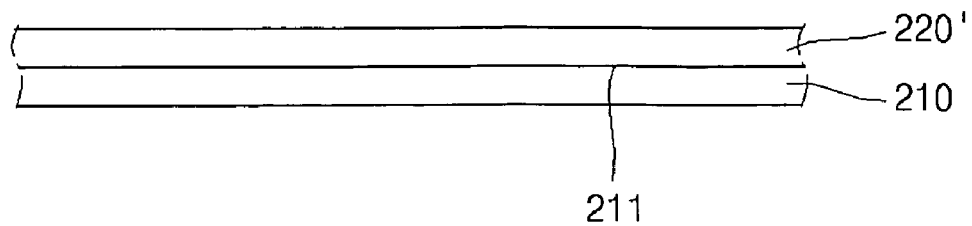
FIGS. 5A–5D illustrate an exemplary sequence of steps which may be used to facilitate the fabrication of the leadframe of the second embodiment shown in FIGS. 2A and 2B.
Figure 5B:
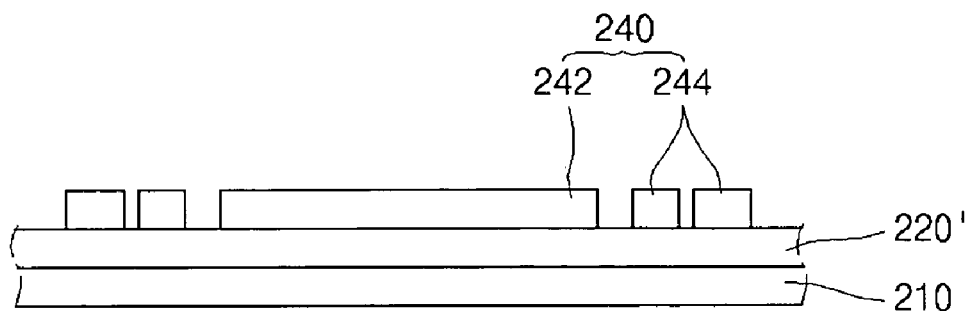

Referring now to FIGS. 5A–5D, there is shown an exemplary sequence of steps which may be used to facilitate the fabrication of the leadframe 200 of the second embodiment of the present invention. In the initial step of the fabrication process, a conductive layer 220' is applied or plated on the first surface 211 of the copper plate 210 (FIG. 5A). Thereafter, a photoresist layer 240 of predetermined thickness is applied to the conductive layer 220'. Subsequent to the application of the photoresist layer 240 to the conductive layer 220', the photoresist layer 240 is patterned by a conventional etching process such that portions of the conductive layer 220 are exposed (FIG. 5B). In this regard, the patterning of the photoresist layer 240 results in the same defining a portion 242 which covers a portion of the conductive layer 220' which will ultimately define the die paddle 220, and portions 244 which will ultimately define the leads 230 of the inner and outer sets.

Figure 5C:
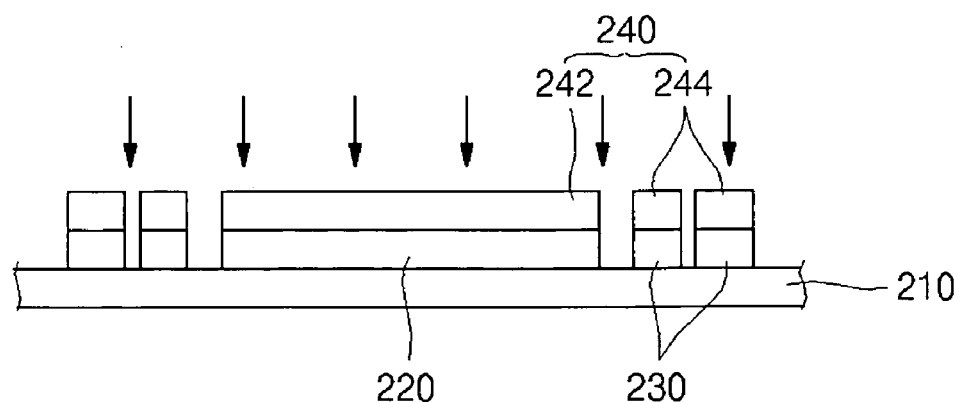
Figure 5D:
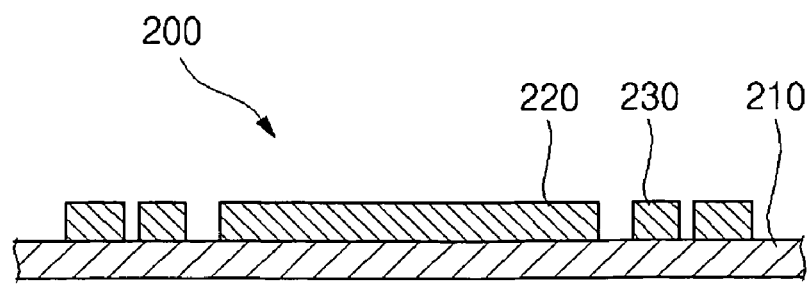

Subsequent to the patterning of the photoresist layer 240, the conductive layer 220' is etched (FIG. 5C). More particularly, those areas of the conductive layer 220' exposed through the photoresist layer 240 are etched and removed by applying a conventional etching gas or solution. The etching gas or solution may be copper chloride, ferric chloride or an equivalent thereof, the present invention not being limited to any particular kind of etching gas or solution. As a result of this etching process, the conductive layer 220' is separated into the die paddle 220 and leads 230 of the inner and outer sets. Subsequent to the etching of the conductive layer 220', the photoresist layer 240 is removed therefrom (FIG. 5D). More particularly, the photoresist layer 240 remaining on the top surface of the die paddle 220 and the top surfaces of the leads 230 of the inner and outer sets is completely removed. The completion of the removal of the photoresist layer 240 completes the formation of the leadframe 200 shown in FIGS. 2A and 2B.

Figure 9A:
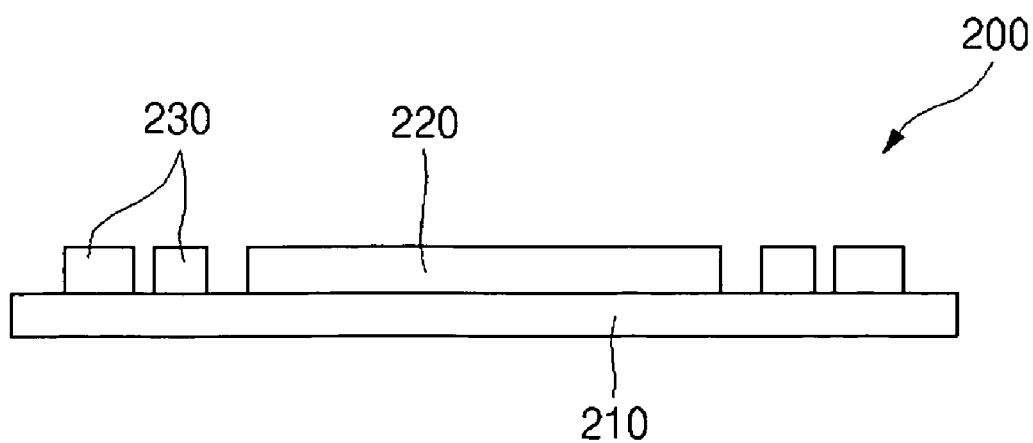
FIGS. 9A–9F illustrate an exemplary sequence of steps which may be used to facilitate the fabrication of a semiconductor package including the leadframe of the second embodiment shown in FIGS. 2A and 2B.
Figure 9B:
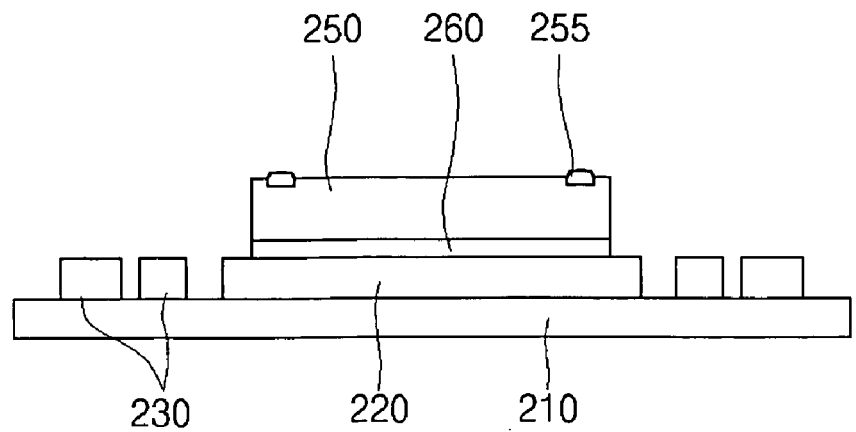

Referring now to FIGS. 9A–9F, there is shown an exemplary sequence of steps which may be used to facilitate the fabrication of a semiconductor package 205 which includes the above-described leadframe 200 constructed in accordance with the second embodiment of the present invention. The initial step of the semiconductor package manufacturing method comprises the fabrication of the leadframe 200 (FIG. 9A). The leadframe 200 is formed through the implementation of the steps described above in relation to FIGS. 5A–5D. Subsequent to the formation of the leadframe 200, a semiconductor die 250 is attached to the top surface of the die paddle 220, such attachment preferably being facilitated through the use of an adhesive layer 260 (FIG. 9B). The semiconductor die 250 includes a plurality of terminal or bond pads 255 which are disposed on the top surface thereof.

Figure 9C:
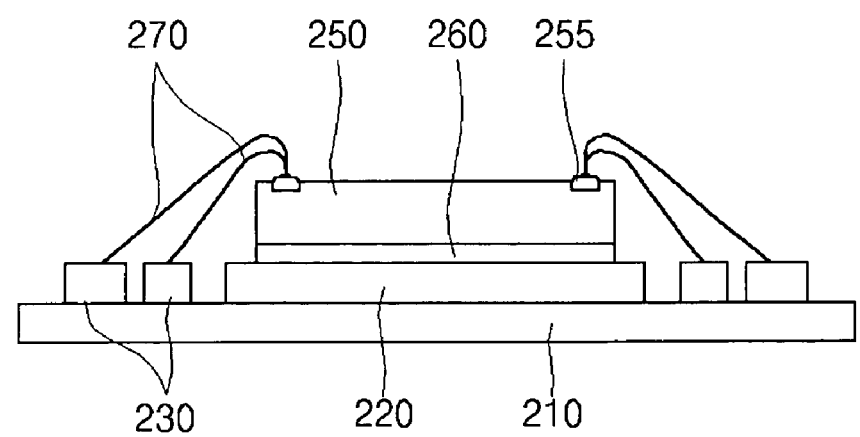

Subsequent to the attachment of the semiconductor die 250 to the die paddle 220, the bond pads 255 of the semiconductor die 250 are electrically connected to at least some of the leads 230 of the inner and outer sets thereof through the use of conductive wires 270 (FIG. 9C). The conductive wires 270 my each comprise an aluminum wire, a gold wire, a copper wire or an equivalent thereof, the present invention not being limited to any specific material for the conductive wires 270. As indicated above, conductive wires 270 may be used to electrically connect bond pads 255 of the semiconductor die 250 to one or more of the leads 230', and thereafter from the leads 230' to other leads 230 of the inner and/or outer sets thereof. With this type of construction, it is possible to avoid a sweeping phenomenon caused by an excessively long conductive wire.

Figure 9D:
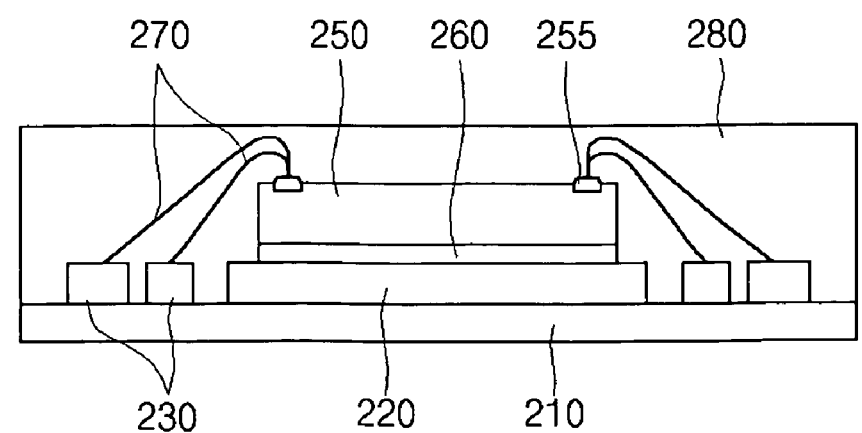

Subsequent to the electrical connection of the semiconductor die 250 to at least some of the leads 230, the semiconductor die 250, conductive wires 270, and portions of the die paddle 220 and leads 230 are encapsulated with an encapsulant which, upon hardening, forms a package body 280 of the semiconductor package 205 (FIG. 9D). The package body 280, and in particular, the encapsulant used to fabricate the same, may be made of an epoxy molding compound, glop top material, or an equivalent thereof, though the present invention is not limited to any particular material for the package body 280. As is seen in FIG. 9D, those areas of the first surface 211 of the copper plate 210 which are not covered by the leads 230 are covered with the encapsulant material which ultimately hardens into the package body 280.

Figure 9E:
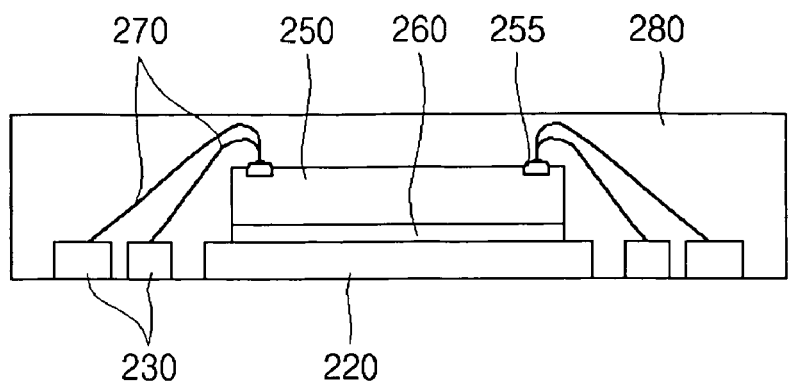

Subsequent to the formation of the package body 280, the copper plate 210 is removed from the package body 280, die paddle 220 and leads 230 (FIG. 9E). Such removal may be facilitated through the implementation of an etching process. As a result of such removal, the generally planar bottom surface of the die paddle 220 is exposed in and substantially flush with the generally planar bottom surface of the package body 280. Similarly, the generally planar bottom surfaces of the leads 230 of the inner and outer sets thereof are exposed in and substantially flush with the bottom surface of the package body 280.

Figure 9F:
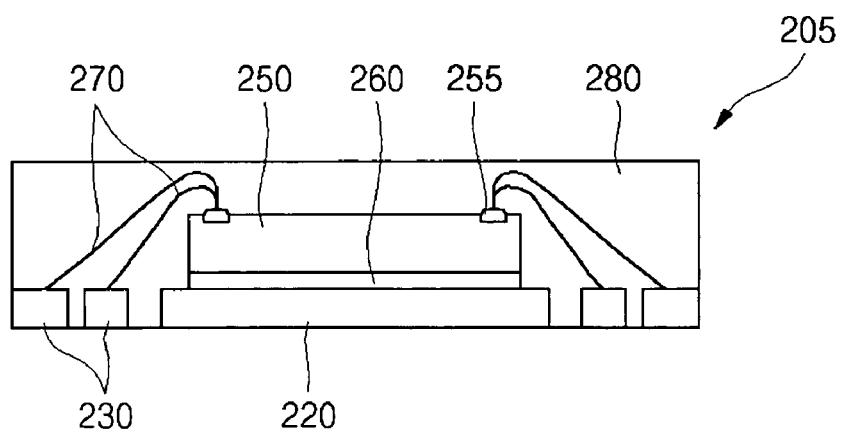

Upon the removal of the copper plate 210, a singulation step is completed wherein that portion of the package body 280 extending outwardly beyond the leads 230 of the outer set is removed (FIG. 9F). The singulation step may be completed through the implementation of either a punching process or a sawing process using a diamond saw. As a result of the completion of the singulation process, the generally planar outer ends of the leads 230 of the outer set are exposed in and substantially flush with respective generally planar side surfaces of the package body 280.

Figure 10A:
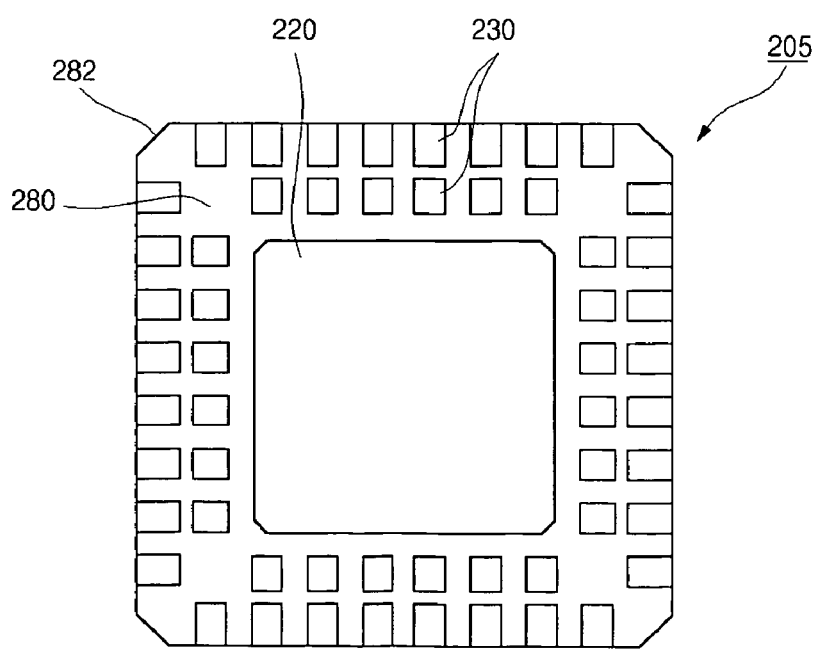
FIG. 10A is a bottom plan view of a semiconductor package including the leadframe of the second embodiment shown in FIGS. 2A and 2B.

A bottom plan view of the completed semiconductor package 205 fabricated to include the leadframe 200 is shown in FIG. 10A. If a punching process is used to complete the singulation step, the package body 280 will typically include chamfers 282 at each of the corners thereof. As indicated above, in the completed semiconductor package 205, the generally planar bottom surface of the die paddle 220 and the generally planar bottom surfaces of the leads 230 of the inner and outer sets are exposed in and substantially flush with the generally planar bottom surface of the package body 280. Further, the leads 230 of the outer set extend to respective side surfaces of the package body 280, with the outer, distal ends of the leads 230 of the outer set being exposed in and substantially flush with respective side surfaces of the package body 280.

Figure 10B:
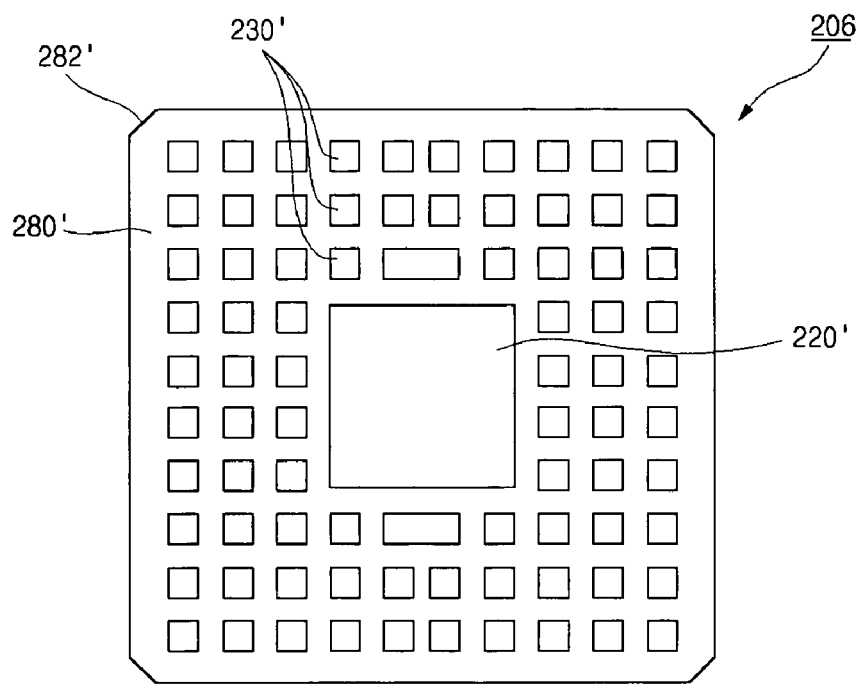
FIG. 10B is a bottom plan view of a semiconductor package including a variation of the leadframe of the second embodiment shown in FIGS. 2A and 2B.

Those of ordinary skill in the art will recognize that the above-described methodology employed to facilitate the fabrication of the leadframe 200 and thereafter the complete semiconductor package 205 may also be used to facilitate the formation of a semiconductor package including more than two sets of leads 230. In this regard, one such alternative semiconductor package 206 is shown in FIG. 10B. The semiconductor package 206 is formed in essentially the same manner as the semiconductor package 205, except that the conductive layer applied to the copper plate 210 is patterned to define three sets of leads 230', i.e., an inner set, an outer set and a middle set disposed between the inner and outer sets. In all other aspects, the semiconductor package 206 is virtually identical to the semiconductor package 205, the semiconductor package 206 also including a die paddle 220' and a package body 280' (including chamfered corners 282'). Those of ordinary skill in the art will further recognize that the fabrication methodology described above in relation to the semiconductor package 205 may also be varied as needed to facilitate the formation of a semiconductor package including more than three sets of leads.

Figure 3A:
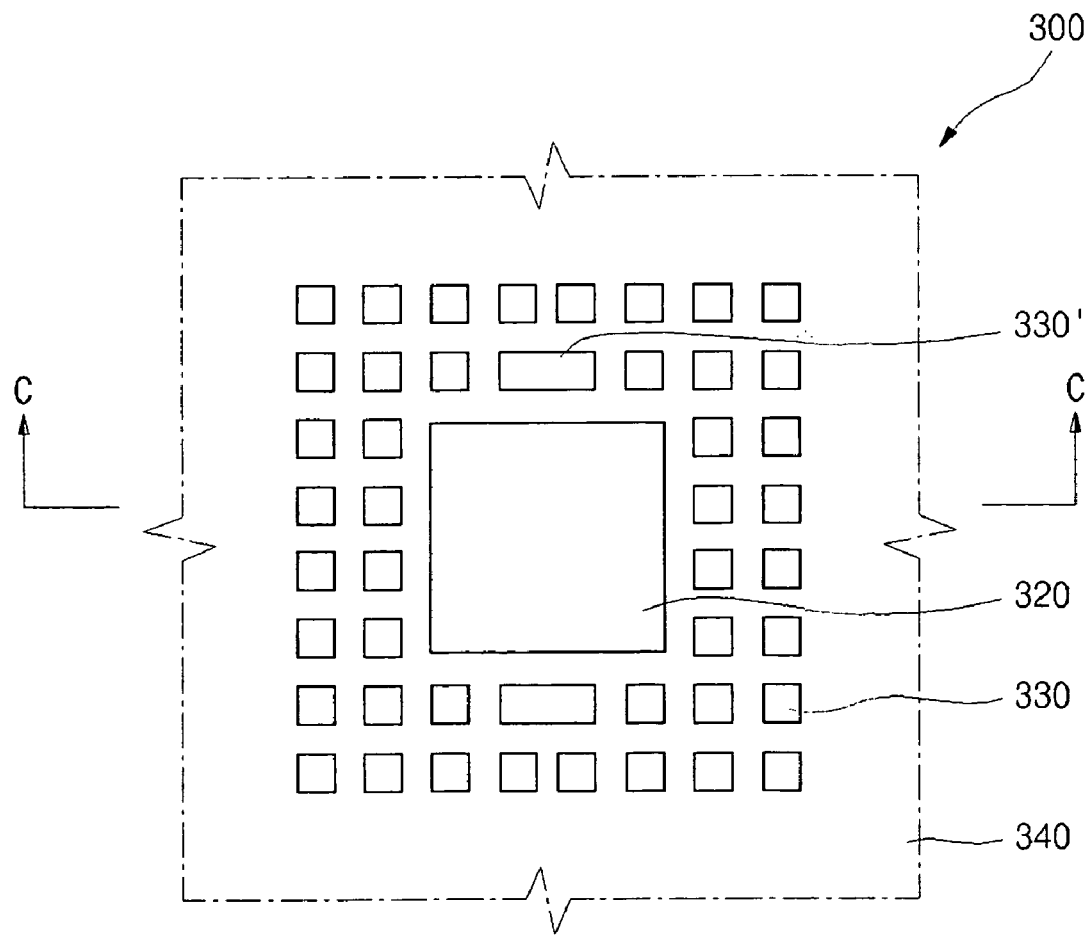
FIG. 3A is a top plan view of a leadframe formed in accordance with a third embodiment of the present invention.
Figure 3B:
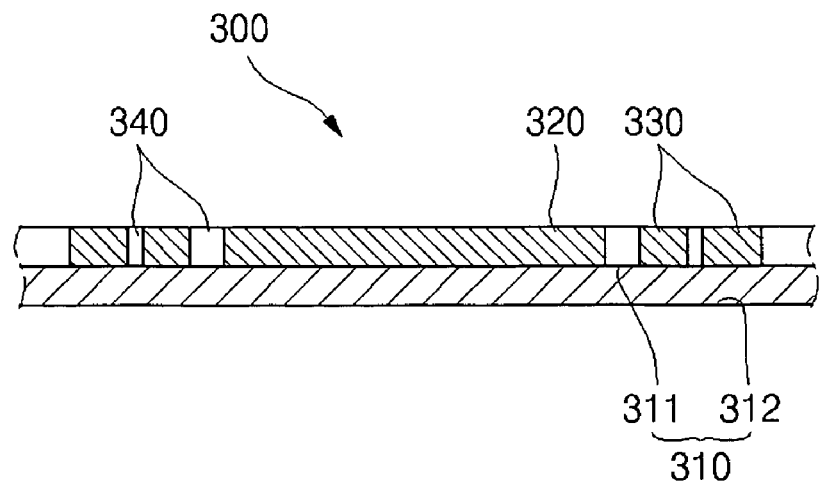
FIG. 3B is a cross-sectional view of the leadframe of the second embodiment taken along line C—C of FIG. 3A.

Referring now to FIGS. 3A and 3B, there is shown a leadframe 300 which is formed in accordance with a third embodiment of the present invention. The leadframe 300 comprises a copper plate 310 which has a generally planar first (top) surface 311 and an opposed, generally second (bottom) surface 312. In addition to the copper plate 310, the leadframe 300 comprises a die paddle 220 which preferably has a generally quadrangular shape defining four sides or peripheral edge segments. Though the die paddle 320 is shown in FIG. 3A as having a generally square configuration, those of ordinary skill in the art will recognize that the die paddle 320 may alternatively have any rectangular, octagonal, or circular shape, the present invention not being limited to any particular shape for the die paddle 320.

The leadframe 300 further comprises a plurality of leads 330. As seen in FIGS. 3A and 3B, the leads 330 are arranged in an inner set which circumvents the die paddle 320, and an outer set which circumvents the inner set. The leads 330 of the inner and outer sets each have a quadrangular configuration, though those of ordinary skill in the art will recognize that the leads 330 of the inner and outer sets may have differing shapes. Included with the leads 330 of the inner set are two generally rectangular leads 330' which differ from the remaining leads 330 of the first set which are each generally square. The leads 330' of the inner set may be used for intermediating signals between a semiconductor die and other leads 330 as will be discussed in more detail below.

In the leadframe 300, both the die paddle 320 and the leads 330 of the inner and outer sets are formed from a conductive layer which is applied to the first surface 211 of the copper plate 310 in a manner which will be described in more detail below. As with the first and second conductive layers 140 described above in relation to the leadframe 100, the conductive layer of the leadframe 300 is formed from a suitable conductive material which is not removed by ammonia or another agent capable of selectively etching and removing copper, exemplary materials for the conductive layer being the same as described above in relation to the first and second conductive layers 140. The conductive layer of the leadframe 300 is also formed to be of predetermined thickness.

Figure 6A:
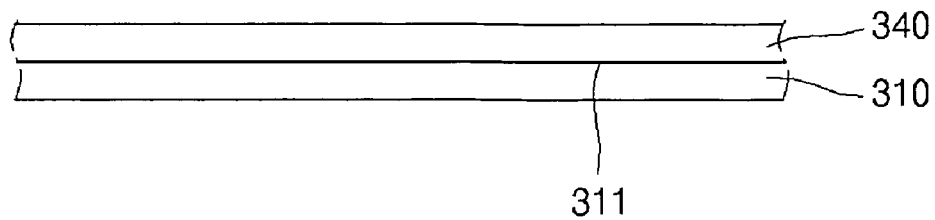
FIGS. 6A–6C illustrate an exemplary sequence of steps which may be used to facilitate the fabrication of the leadframe of the third embodiment shown in FIGS. 3A and 3B.
Figure 6B:
Figure 6C:
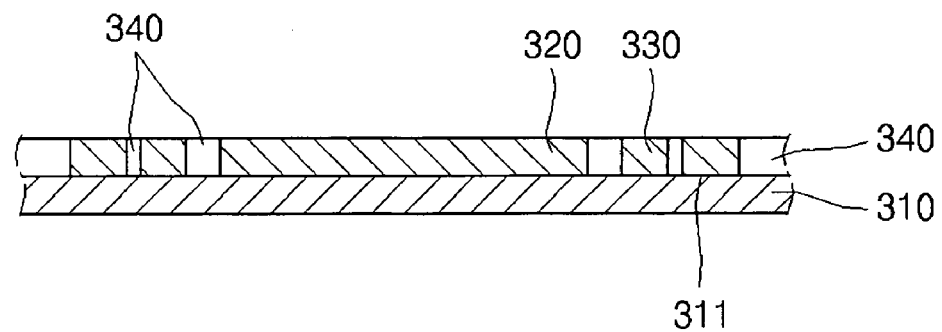

Referring now to FIGS. 6A–6C, there is shown an exemplary sequence of steps which may be used to facilitate the fabrication of the leadframe 300 of the third embodiment of the present invention. In the initial step of the fabrication process, a photoresist layer 340 of predetermined thickness is applied to the first surface 311 of the copper plate 310 (FIG. 6A). Subsequent to the application of the photoresist layer 340 to the copper plate 310, the photoresist layer 340 is patterned by a conventional etching process such that portions of the first surface 311 of the underlying copper plate 310 are exposed (FIG. 6B). The patterning of the photoresist layer 340 results in the same defining portions which will ultimately define the boundaries of the die paddle 320 and leads 330 of the inner and outer sets.

Subsequent to the patterning of the photoresist layer 340, the conductive layer is applied to the exposed areas of the first surface 311 of the copper plate 310, thus facilitating the formation of the die paddle 320 and leads 330 of the inner and outer sets (FIG. 6C). The application of the conductive layer to the copper plate 310 completes the formation of the leadframe 300 shown in FIGS. 3A and 3B, the residual portion of the photoresist layer 340 comprising part of the completed leadframe 300.

Figure 11A:
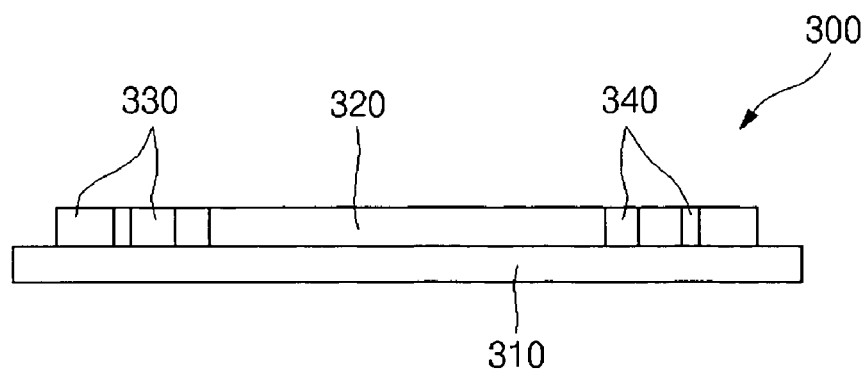
FIGS. 11A–11F illustrate an exemplary sequence of steps which may be used to facilitate the fabrication of a semiconductor package including the leadframe of the third embodiment shown in FIGS. 3A and 3B.
Figure 11B:
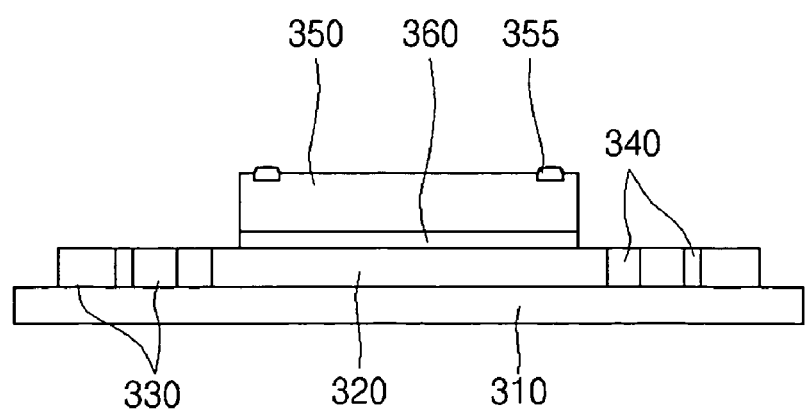

Referring now to FIGS. 11A–11F, there is shown an exemplary sequence of steps which may be used to facilitate the fabrication of a semiconductor package 305 which includes the above-described leadframe 300 constructed in accordance with the third embodiment of the present invention. The initial step of the semiconductor package manufacturing method comprises the fabrication of the leadframe 300 (FIG. 11A). The leadframe 300 is formed through the implementation of the steps described above in relation to FIGS. 6A–6C. Subsequent to the formation of the leadframe 300, a semiconductor die 350 is attached to the top surface of the die paddle 320, such attachment preferably being facilitated through the use of an adhesive layer 360 (FIG. 11B). The semiconductor die 350 includes a plurality of terminal or bond pads 355 which are disposed on the top surface thereof.

Figure 11C:
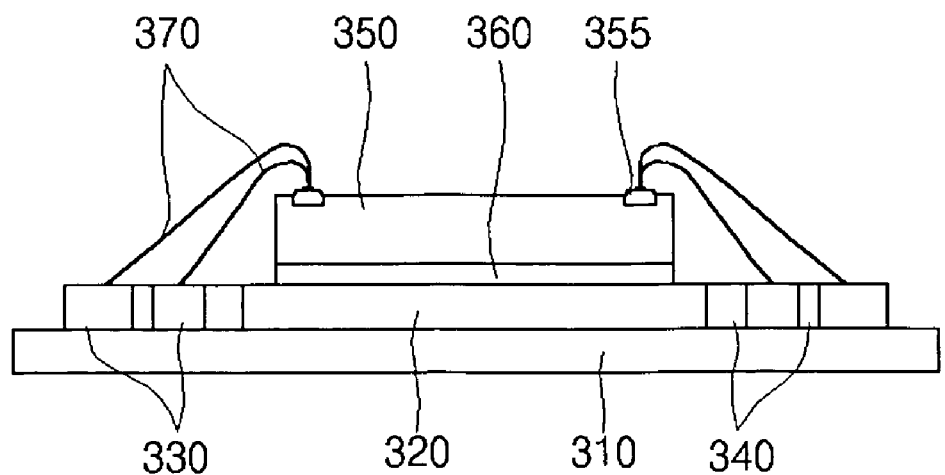

Subsequent to the attachment of the semiconductor die 350 to the die paddle 320, the bond pads 355 of the semiconductor die 350 are electrically connected to at least some of the leads 330 of the inner and outer sets thereof through the use of conductive wires 370 (FIG. 11C). The conductive wires 370 my each comprise an aluminum wire, a gold wire, a copper wire or an equivalent thereof, the present invention not being limited to any specific material for the conductive wires 370. As indicated above, conductive wires 370 may be used to electrically connect bond pads 355 of the semiconductor die 350 to one or more of the leads 330', and thereafter from the leads 330' to other leads 330 of the inner and/or outer sets thereof. With this type of construction, it is possible to avoid a sweeping phenomenon caused by an excessively long conductive wire.

Figure 11D:
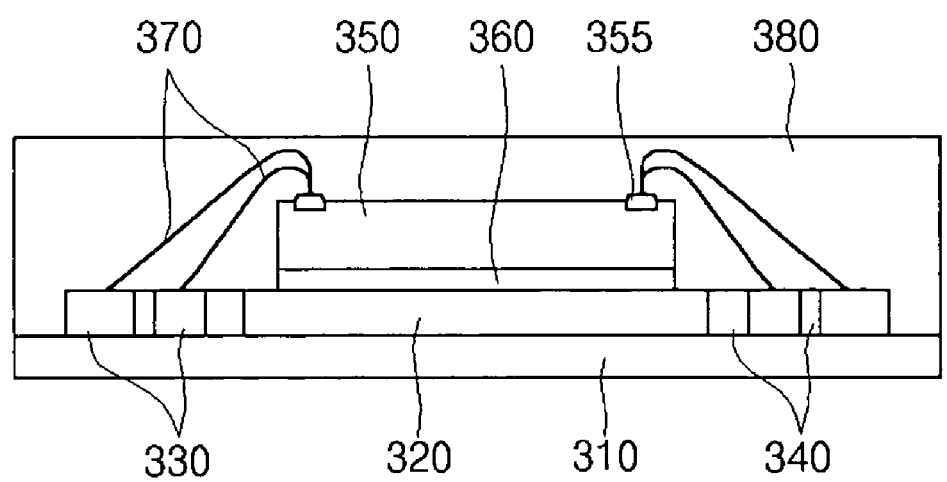

Subsequent to the electrical connection of the semiconductor die 350 to at least some of the leads 330, the semiconductor die 350, conductive wires 370, and portions of the die paddle 320 and leads 330 are encapsulated with an encapsulant which, upon hardening, forms a package body 380 of the semiconductor package 305 (FIG. 11D). The package body 380, and in particular, the encapsulant used to fabricate the same, may be made of an epoxy molding compound, glop top material, or an equivalent thereof, though the present invention is not limited to any particular material for the package body 380.

Figure 11E:
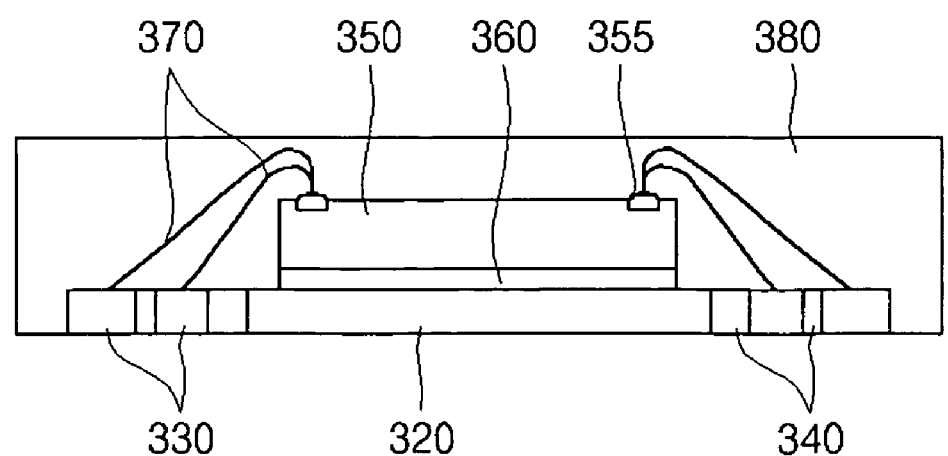

Subsequent to the formation of the package body 380, the copper plate 310 is removed from the package body 380, die paddle 320 and leads 330 (FIG. 11E). Such removal may be facilitated through the implementation of an etching process. As a result of such removal, the generally planar bottom surface of the die paddle 320 is exposed in and substantially flush with the generally planar bottom surface of the package body 380. Similarly, the generally planar bottom surfaces of the leads 330 of the inner and outer sets thereof are exposed in and substantially flush with the bottom surface of the package body 380. Also exposed in and substantially flush with the bottom surface of the package body 380 is the generally planar bottom surface of the residual portion of the photoresist layer 340.

Figure 11F:
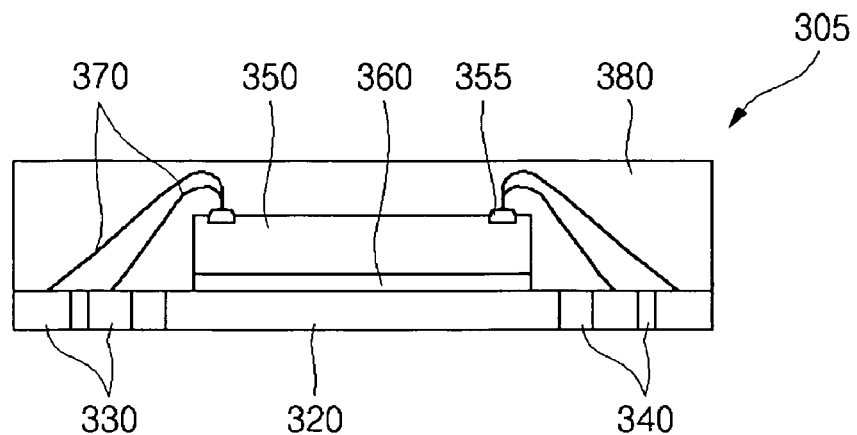

Upon the removal of the copper plate 310, a singulation step is completed wherein that portion of the package body 380 extending outwardly beyond the leads 330 of the outer set is removed (FIG. 11F). The singulation step may be completed through the implementation of either a punching process or a sawing process using a diamond saw. As a result of the completion of the singulation process, the generally planar outer ends of the leads 330 of the outer set are exposed in and substantially flush with respective generally planar side surfaces of the package body 280.

Figure 12:
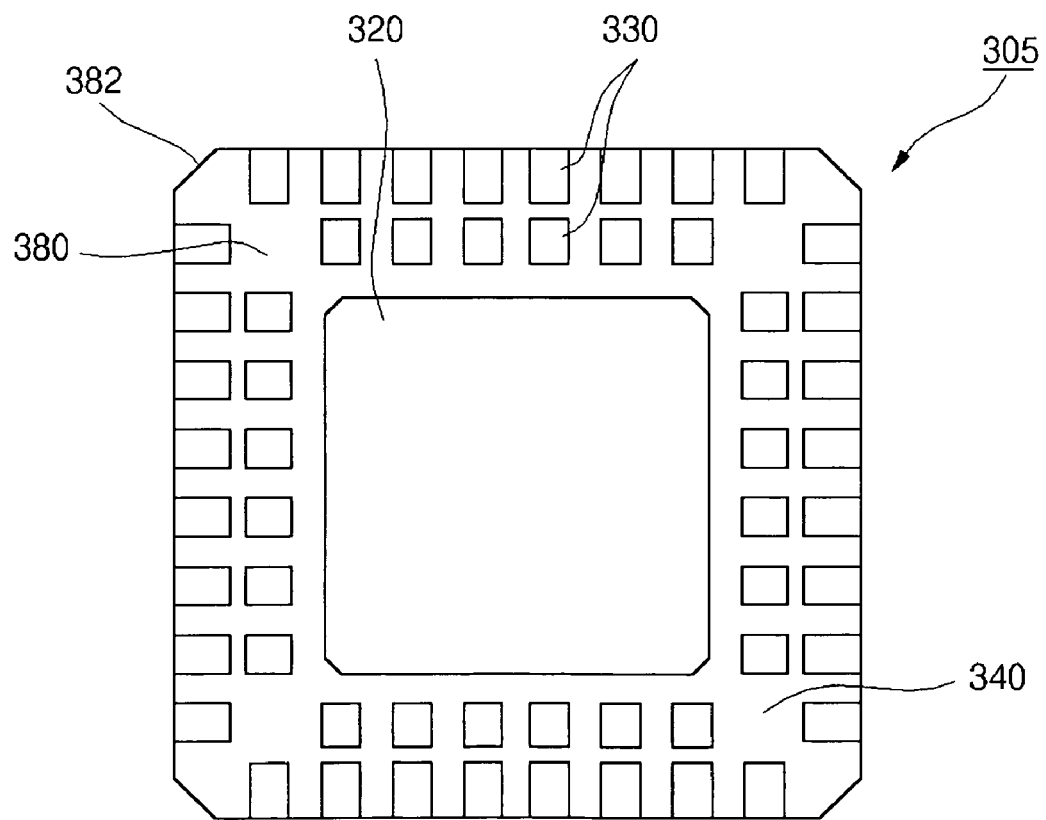
FIG. 12 is a bottom plan view of a semiconductor package including the leadframe of the third embodiment shown in FIGS. 3A and 3B.

A bottom plan view of the completed semiconductor package 305 fabricated to include the leadframe 300 is shown in FIG. 12. If a punching process is used to complete the singulation step, the package body 380 will typically include chamfers 382 at each of the corners thereof. As indicated above, in the completed semiconductor package 305, the generally planar bottom surface of the die paddle 320 and the generally planar bottom surfaces of the leads 330 of the inner and outer sets are exposed in and substantially flush with the generally planar bottom surface of the package body 380. Further, the leads 230 of the outer set extend to respective side surfaces of the package body 280, with the outer, distal ends of the leads 230 of the outer set being exposed in and substantially flush with respective side surfaces of the package body 280. Also exposed in and substantially flush with the bottom surface of the package body 380 is the generally planar bottom surface of the residual portion of the photoresist layer 340.

Those of ordinary skill in the art will recognize that the above-described methodology employed to facilitate the fabrication of the leadframe 300 and thereafter the complete semiconductor package 305 may also be used to facilitate the formation of a semiconductor package including more than two sets of leads 330. In this regard, the photoresist layer 340 may be patterned such that the subsequent plating of the conductive layer to the copper plate 310 facilitates the formation of three or more sets of the leads 330.

Figure 13A:
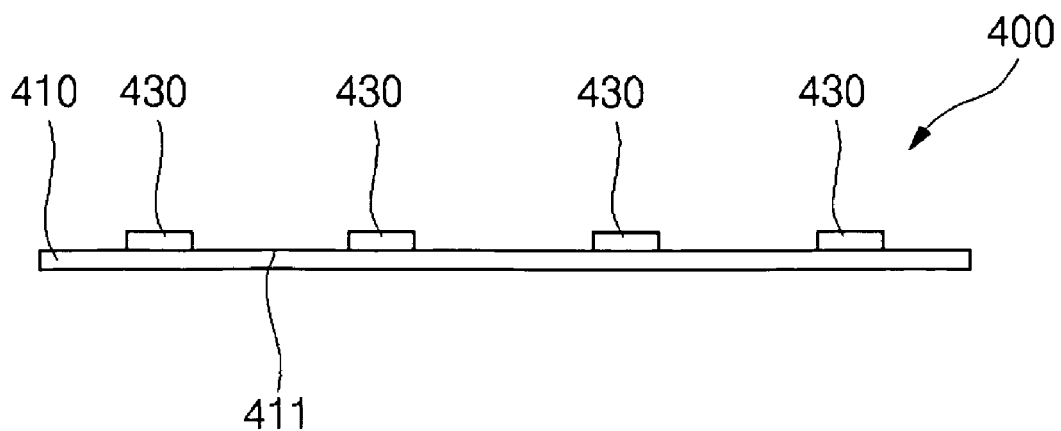
FIGS. 13A–13D illustrate an exemplary sequence of steps which may be used to facilitate the fabrication of a semiconductor package including a leadframe fabricated in accordance with a fourth embodiment of the present invention.

Referring now to FIGS. 13A–13D, there is shown an exemplary sequence of steps for facilitating the fabrication of a flip chip style semiconductor package 405 in accordance with a fourth embodiment of the present invention. In the initial step of the fabrication methodology, a leadframe 400 is provided (FIG. 13A). The leadframe 400 is fabricated through essentially the same process used to facilitate the fabrication of the leadframe 200 of the second embodiment. However, in the fabrication process for the leadframe 400, the die paddle 220 of the above-described leadframe 200 is substituted with additional leads 430. Thus, the leadframe 400 of the fourth embodiment has a plurality of leads 430 which are included on the first surface 411 of the copper plate 410 in spaced relation to each other.

Figure 13B:
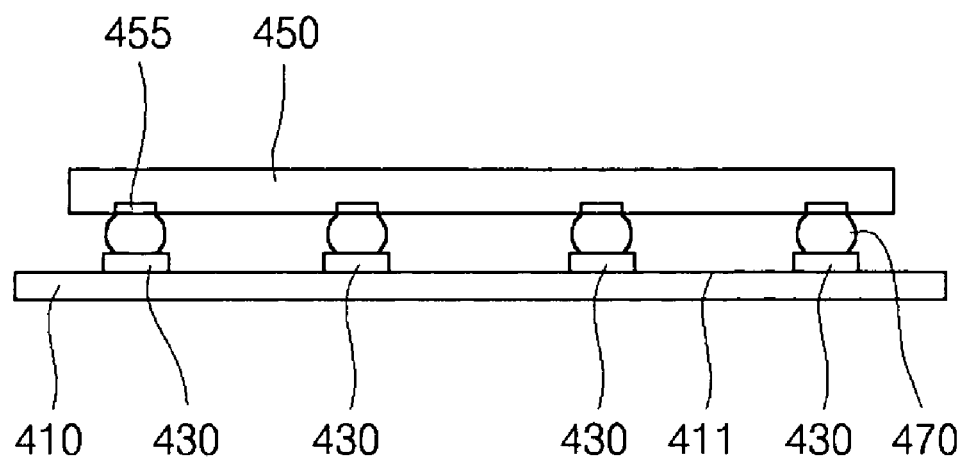

Subsequent to the formation of the leadframe 400, a semiconductor die 450 is electrically connected to the leads 430 (FIG. 13B). The semiconductor die 450 has a plurality of terminals or bond pads 455 which are disposed on the bottom surface thereof. Formed or welded onto each bond pad 455 is a solder ball 470. Accordingly, the bond pads 455 of the semiconductor die 450 are mechanically and electrically connected to the leads 430 of the leadframe 400 by respective ones of the solder balls 470.

Figure 13C:
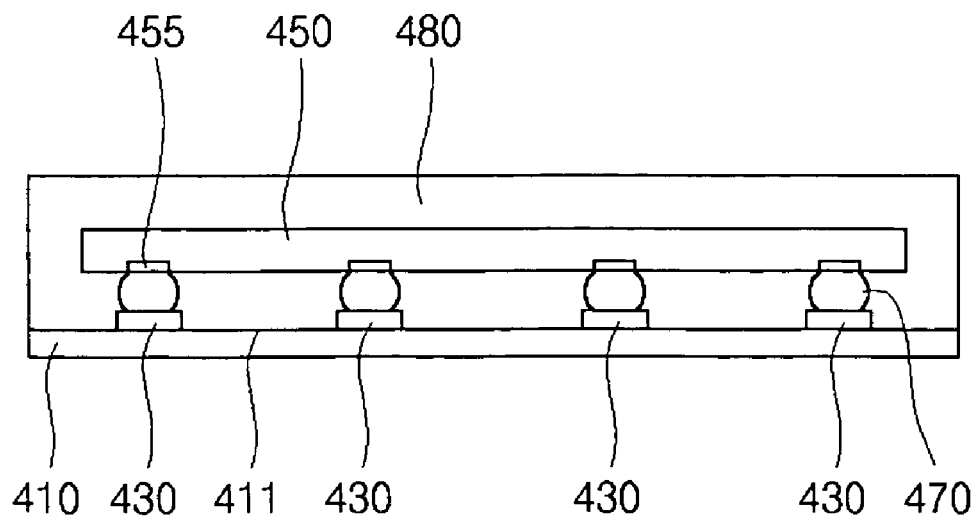

Subsequent to the electrical connection of the semiconductor die 450 to the leadframe 400 in the above-described manner, the semiconductor die 450, the leads 430 and the solder balls 470 are encapsulated with an encapsulant which, upon hardening, forms a package body 480 of the semiconductor package 405 (FIG. 13C). The package body 480, and in particular the encapsulant used to fabricate the same, may be made of an epoxy molding compound, glop top material, or an equivalent thereof, though the present invention is not limited to any particular material for the package body 480. As seen in FIG. 13C, those areas of the first surface 411 of the copper plate 410 which are not covered by the leads 430 are covered with the encapsulant material which ultimately hardens into the package body 480.

Figure 13D:
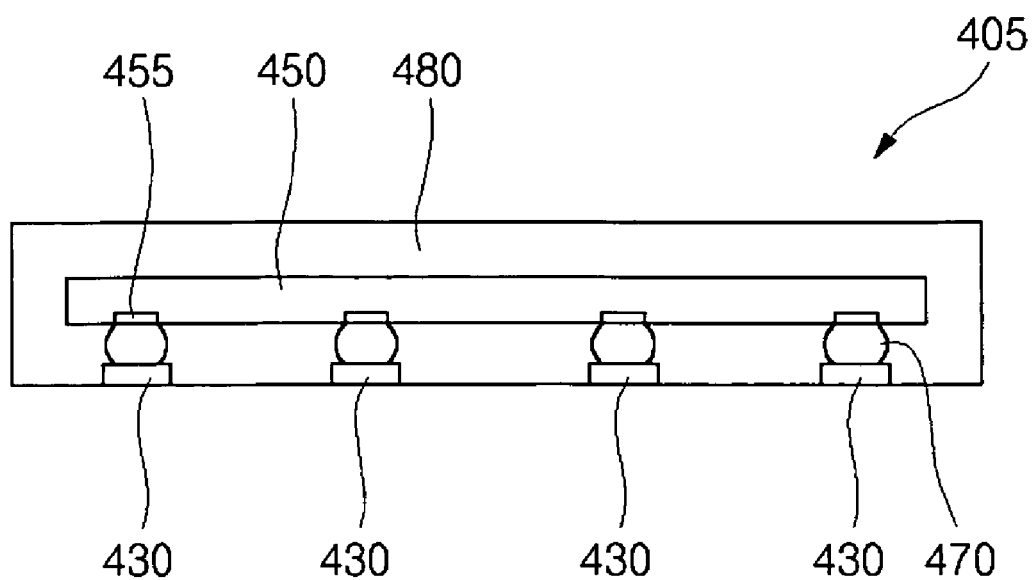

Subsequent to the formation of the package body 480, the copper plate 410 is removed from the package body 480 and leads 430 (FIG. 13D). Such removal may be facilitated through the implementation of an etching process. As a result of such removal, the generally planar bottom surfaces of the leads 430 are exposed in and substantially flush with the generally planar bottom surface of the package body 480. The removal of the copper plate 410 completes the fabrication of the semiconductor package 405 of the fourth embodiment. Though not shown, those of ordinary skill in the art will recognize that the flip chip style semiconductor package 405 described above may alternatively be fabricated through the use of the leadframe 300 as an alternative to the leadframe 200.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method for manufacturing a semiconductor package, comprising the steps of:
   a) applying first and second photoresist layers to respective ones of opposed first and second surfaces of a metal plate which includes a die paddle and a plurality of leads extending at least partially about the die paddle in spaced relation thereto;
   b) patterning the first and second photoresist layers to expose the die paddle and prescribed portions of each of the leads;
   c) applying first and second conductive layers to portions of respective ones of the first and second surfaces which are not covered by the first and second photoresist layers;
   d) removing the first and second photoresist layers to facilitate the creation of an exposed area in each of leads which is not covered by the first and second conductive layers;
   e) attaching a semiconductor die to a portion of the first conductive layer covering the die paddle;
   f) electrically connecting the semiconductor die to portions of the first conductive layer covering the leads;
   g) at least partially encapsulating the semiconductor die, the die paddle, the leads and the first and second conductive layers with a package body such that portions of the second conductive layer covering the die paddle and the leads, and the exposed area of each of the leads are exposed in a common surface of the package body; and
   h) etching the exposed area of each of the leads to facilitate the division of the leads into an inner set extending at least partially about the die paddle and an outer set extending at least partially about the inner set.

2. The method of claim 1 wherein step (f) comprises electrically connecting the semiconductor die to portions of the first conductive layer covering the leads through the use of conductive wires which are encapsulated by the package body in step (g).

3. The method of claim 1 further comprising the step of:
   i) singulating the package body such that an outer end of each of the leads of the outer set is exposed in a side surface of the package body.

4. The method of claim 3 wherein step (i) is completed by a punching process.

5. The method of claim 1 wherein step (a) comprises applying the first and second photoresist layers to respective ones of the opposed first and second surfaces of a copper plate.

6. A method for manufacturing a semiconductor package, comprising the steps of:
   a) applying a conductive layer to a metal plate;
   b) applying a photoresist layer to the conductive layer;
   c) patterning the photoresist layer to expose a prescribed area of the conductive layer;
   d) etching the exposed area of the conductive layer to facilitate the division of the conductive layer into a die paddle, an inner set of leads which extends at least partially about the die paddle, and an outer set of leads which extends at least partially about the inner set;
   e) removing the photoresist layer from the die paddle and from the leads of the inner and outer sets thereof formed in step (d);
   f) attaching a semiconductor die to the die paddle;
   g) electrically connecting the semiconductor die to at least some of the leads of each of the inner and outer sets thereof;

h) at least partially encapsulating the semiconductor die, the die paddle, the leads of the inner and outer sets, and the metal plate with a package body; and i) removing the metal plate from the package body such that such that the die paddle and the leads of the inner and outer sets are exposed in a common surface of the package body.

7. The method of claim 6 wherein step (g) comprises electrically connecting the semiconductor die to at least some of the leads of the inner and outer sets through the use of conductive wires which are encapsulated by the package body in step (h).

8. The method of claim 6 further comprising the step of:

j) singulating the package body such that an outer end of each of the leads of the outer set is exposed in a side surface of the package body.

9. The method of claim 8 wherein step (j) is completed by a punching process.

10. The method of claim 6 wherein step (a) comprises applying the conductive layer to a copper plate.

11. The method of claim 6 wherein step (d) comprises etching the exposed area of the conductive layer to facilitate the division thereof into a quadrangular die paddle defining four peripheral edge segments, an inner set of leads which extends along each of the peripheral edge segments of the die paddle, and an outer set of leads which circumvents the inner set.

12. The method of claim 6 wherein step (d) comprises etching the exposed area of the conductive layer to facilitate the division thereof into a die paddle, an inner set of leads which extends at least partially about the die paddle, a middle set of leads which extends at least partially about the inner set, and an outer set of leads which extends at least partially about the middle set.

13. The method of claim 12 wherein step (d) comprises etching the exposed area of the conductive layer to facilitate the division thereof into a quadrangular die paddle defining four peripheral edge segments, an inner set of leads which extends along each of the peripheral edge segments of the die paddle, a middle set of leads which circumvents the inner set, and an outer set of leads which circumvents the middle set.

14. A method for manufacturing a semiconductor package, comprising the steps of:

a) applying a photoresist layer to a metal plate;

b) patterning the photoresist layer to expose prescribed areas of the conductive layer;

c) applying a conductive layer to the exposed areas of the metal plate to facilitate the formation of a die paddle, an inner set of leads which extends at least partially about the die paddle, and an outer set of leads which extends at least partially about the inner set;

d) attaching a semiconductor die to the die paddle;

e) electrically connecting the semiconductor die to at least some of the leads of each of the inner and outer sets thereof;

f) at least partially encapsulating the semiconductor die, the die paddle, the leads of the inner and outer sets, and the photoresist layer with a package body; and g) removing the metal plate from the package body such that such that the die paddle and the leads of the inner and outer sets are exposed in a common surface of the package body.

15. The method of claim 14 wherein step (e) comprises electrically connecting the semiconductor die to at least some of the leads of the inner and outer sets through the use of conductive wires which are encapsulated by the package body in step (f).

16. The method of claim 14 further comprising the step of:

h) singulating the package body such that an outer end of each of the leads of the outer set is exposed in a side surface of the package body.

17. The method of claim 14 wherein step (a) comprises applying the photoresist layer to a copper plate.

18. The method of claim 14 wherein step (c) comprises applying the conductive layer to the exposed area of the metal plate to facilitate the formation of a quadrangular die paddle defining four peripheral edge segments, an inner set of leads which extends along each of the peripheral edge segments of the die paddle, and an outer set of leads which circumvents the inner set.

19. A method for manufacturing a semiconductor package, comprising the steps of:

a) applying a conductive layer to a metal plate;

b) applying a photoresist layer to the conductive layer;

c) patterning the photoresist layer to expose a prescribed area of the conductive layer;

d) etching the exposed area of the conductive layer to facilitate the division of the layer into a plurality of leads;

e) removing the photoresist layer from the leads formed in step (d);

f) electrically attaching a semiconductor die to the leads;

g) at least partially encapsulating the semiconductor die, the leads, and the metal plate with a package body; and h) removing the metal plate from the package body such that such that the leads are exposed in a common surface of the package body.

20. The method of claim 19 wherein step (a) comprises applying the conductive layer to a copper plate.

* * * * *